United States Patent
Okajima

[11] Patent Number: 6,163,832
[45] Date of Patent: Dec. 19, 2000

[54] SEMICONDUCTOR MEMORY DEVICE INCLUDING PLURAL BLOCKS WITH A PIPELINE OPERATION FOR CARRYING OUT OPERATIONS IN PREDETERMINED ORDER

[75] Inventor: Yoshinori Okajima, Kawasaki, Japan

[73] Assignee: Fujitsu Limited, Kawasaki, Japan

[21] Appl. No.: 08/790,964

[22] Filed: Jan. 29, 1997

[30] Foreign Application Priority Data

Feb. 2, 1996 [JP] Japan .................................. 8-017990

[51] Int. Cl.⁷ ............................. G06F 13/00; G06F 9/38
[52] U.S. Cl. ......................... 711/169; 711/5; 365/230.03
[58] Field of Search .................................. 711/169, 168, 711/167, 5, 150; 365/230.03, 233; 712/23

[56] References Cited

U.S. PATENT DOCUMENTS

| | | | |
|---|---|---|---|
| 4,845,677 | 7/1989 | Chappell et al. | 365/230.03 |
| 4,954,946 | 9/1990 | Natusch et al. | 711/169 |
| 5,043,883 | 8/1991 | Inouchi et al. | 711/169 |
| 5,060,145 | 10/1991 | Scheuneman et al. | 711/169 |
| 5,293,347 | 3/1994 | Ogawa | 365/189.01 |
| 5,384,745 | 1/1995 | Konishi et al. | 365/230.03 |
| 5,386,391 | 1/1995 | Watanabe | 365/233 |
| 5,410,670 | 4/1995 | Hansen et al. | 711/169 |
| 5,412,615 | 5/1995 | Noro et al | 365/233 |
| 5,537,555 | 7/1996 | Landry et al. | 710/126 |
| 5,784,705 | 7/1998 | Leung | 711/169 |

FOREIGN PATENT DOCUMENTS

| | | |
|---|---|---|
| 0 384 620 | 8/1990 | European Pat. Off. . |
| 0 498 525 | 8/1992 | European Pat. Off. . |
| 58-115674 | 7/1983 | Japan . |
| 2-310887 | 12/1990 | Japan . |
| 88/09995 | 12/1988 | WIPO . |

*Primary Examiner*—Glenn Gossage
*Attorney, Agent, or Firm*—Arent Fox Kintner Plotkin & Kahn PLLC

[57] ABSTRACT

A semiconductor device including a plurality of blocks, each individual block of the plurality of blocks being capable of carrying out different types of internal operations, one internal operation at a time, and each internal operation lasting one cycle. A control unit configured to successively select one individual block after another from said plurality of blocks during each cycle is provided. The device is further configured upon selection of one individual block by the control unit, to execute the different types of internal operations one after another in a predetermined order and carry out the different types of internal operations in the one individual selected block in a pipe-line operation.

17 Claims, 25 Drawing Sheets

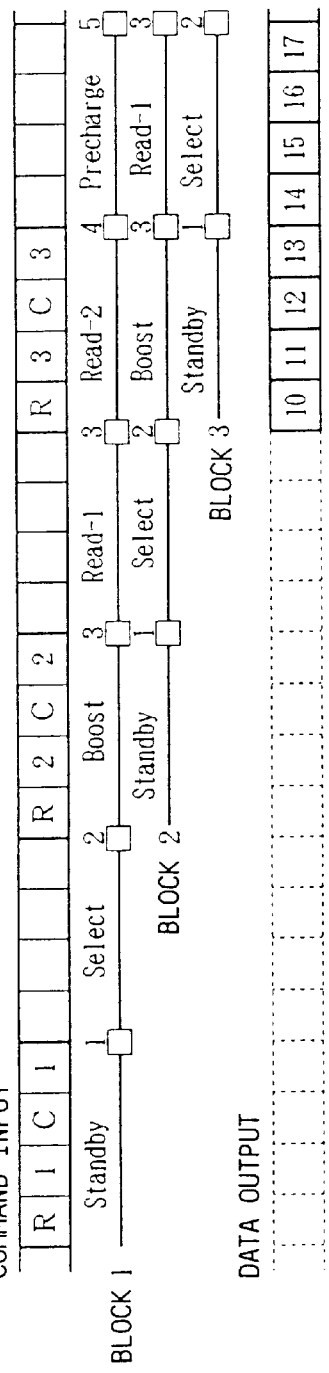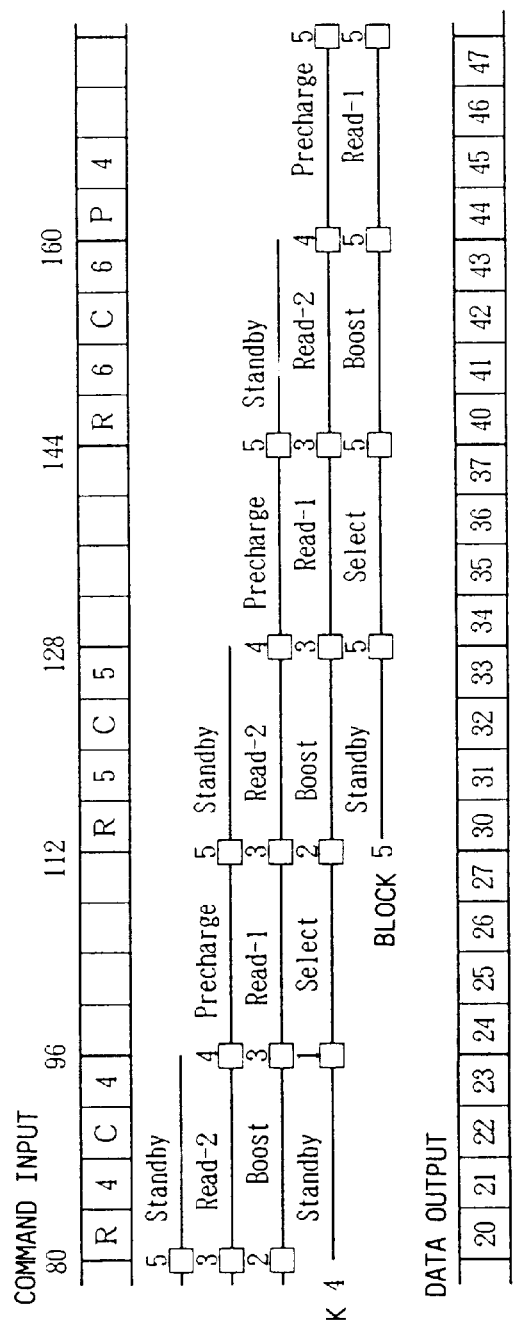

FIG.5A

| | STRBLN | INPUT SIGNAL DESCRIPTIONS | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| -3 | 1 | DEVICE ID | | | | | | BANK-ADDRESS | | COMMAND | | | | | | | |
| -2 | 0 | ROW-ADDRESS | | | | | | | | PAGE-BLOCK-ADDRESS | | | | | | | |
| -1 | 1 | COLUMN-ADDRESS | | | | | | | | OPEN | | | | | | | |
| 0 | 0 | NO-USE | | | | | | | | | | | | | | | |

FIG.5B

- .1="CONTROL AND STATUS RESISTER ACCESS" .0="CORE ACCESS"
- .1="REFRESH" .0="READ OR WRITE OPERATION"
- .1="OPEN ROW" .0="NOT OPEN ROW"
- .1="WRITE" .0="READ AND OTHERS"
- .000="BURST-0" .001="RESERVED" .010="BURST-2"
- .011="BURST-4" .100="BURST-8" .101="BURST-16"
- .110="BURST-32" .111="RESERVED"
- .1="PRECHARGE" .0="WITHOUT PRECHARGE"

| 0 | 1 | 2 | 3 | 4 | 5 | 6 | 7 | COMMAND DESCRIPTIONS |
|---|---|---|---|---|---|---|---|---|
| 0 | 0 | 1 | 0 | 0 | 0 | 0 | 0 | OPEN ROW |
| 0 | 0 | 1 | 0 | 0 | 1 | 0 | 0 | OPEN ROW & READ-BURST-2 |
| 0 | 0 | 1 | 0 | 1 | 1 | 0 | 0 | OPEN ROW & READ-BURST-4 |
| 0 | 0 | 1 | 0 | 0 | 0 | 1 | 0 | OPEN ROW & READ-BURST-8 |
| 0 | 0 | 1 | 0 | 1 | 0 | 1 | 0 | OPEN ROW & READ-BURST-16 |
| 0 | 0 | 1 | 0 | 0 | 1 | 1 | 0 | OPEN ROW & READ-BURST-32 |
| 0 | 0 | 1 | 0 | 0 | 1 | 0 | 0 | OPEN ROW & WRITE-BURST-2 |
| 0 | 0 | 1 | 0 | 1 | 1 | 0 | 0 | OPEN ROW & WRITE-BURST-4 |
| 0 | 0 | 1 | 0 | 0 | 0 | 1 | 0 | OPEN ROW & WRITE-BURST-8 |
| 0 | 0 | 1 | 0 | 1 | 0 | 1 | 0 | OPEN ROW & WRITE-BURST-16 |
| 0 | 0 | 1 | 0 | 0 | 1 | 1 | 0 | OPEN ROW & WRITE-BURST-32 |
| 0 | 0 | 1 | 0 | 0 | 1 | 0 | 1 | OPEN ROW & READ-BURST-2 & PRECHARGE |
| 0 | 0 | 1 | 0 | 1 | 1 | 0 | 1 | OPEN ROW & READ-BURST-4 & PRECHARGE |
| 0 | 0 | 1 | 0 | 0 | 0 | 1 | 1 | OPEN ROW & READ-BURST-8 & PRECHARGE |
| 0 | 0 | 1 | 0 | 1 | 0 | 1 | 1 | OPEN ROW & READ-BURST-16 & PRECHARGE |
| 0 | 0 | 1 | 0 | 0 | 1 | 1 | 1 | OPEN ROW & READ-BURST-32 & PRECHARGE |
| 0 | 0 | 1 | 0 | 0 | 1 | 0 | 1 | OPEN ROW & WRITE-BURST-2 & PRECHARGE |
| 0 | 0 | 1 | 0 | 1 | 1 | 0 | 1 | OPEN ROW & WRITE-BURST-4 & PRECHARGE |
| 0 | 0 | 1 | 0 | 0 | 0 | 1 | 1 | OPEN ROW & WRITE-BURST-8 & PRECHARGE |
| 0 | 0 | 1 | 0 | 1 | 0 | 1 | 1 | OPEN ROW & WRITE-BURST-16 & PRECHARGE |
| 0 | 0 | 1 | 0 | 0 | 1 | 1 | 1 | OPEN ROW & WRITE-BURST-32 & PRECHARGE |
| 0 | 0 | 1 | 0 | 0 | 0 | 0 | 1 | OPEN ROW & PRECHARGE |
| 0 | 0 | 0 | 0 | 0 | 0 | 0 | 1 | PRECHARGE THE SELECTED BLOCK |
| 0 | 0 | 0 | 0 | 0 | 0 | 0 | 0 | COMMAND DESCRIPTIONS |
| 0 | 0 | 0 | 0 | 0 | 1 | 0 | 0 | OPEN ROW & READ-BURST-2 |
| 0 | 0 | 0 | 0 | 1 | 1 | 0 | 0 | OPEN ROW & READ-BURST-4 |
| 0 | 0 | 0 | 0 | 0 | 0 | 1 | 0 | OPEN ROW & READ-BURST-8 |
| 0 | 0 | 0 | 0 | 1 | 0 | 1 | 0 | OPEN ROW & READ-BURST-16 |
| 0 | 0 | 0 | 0 | 0 | 1 | 1 | 0 | OPEN ROW & READ-BURST-32 |
| 0 | 0 | 0 | 0 | 0 | 1 | 0 | 0 | OPEN ROW & WRITE-BURST-2 |

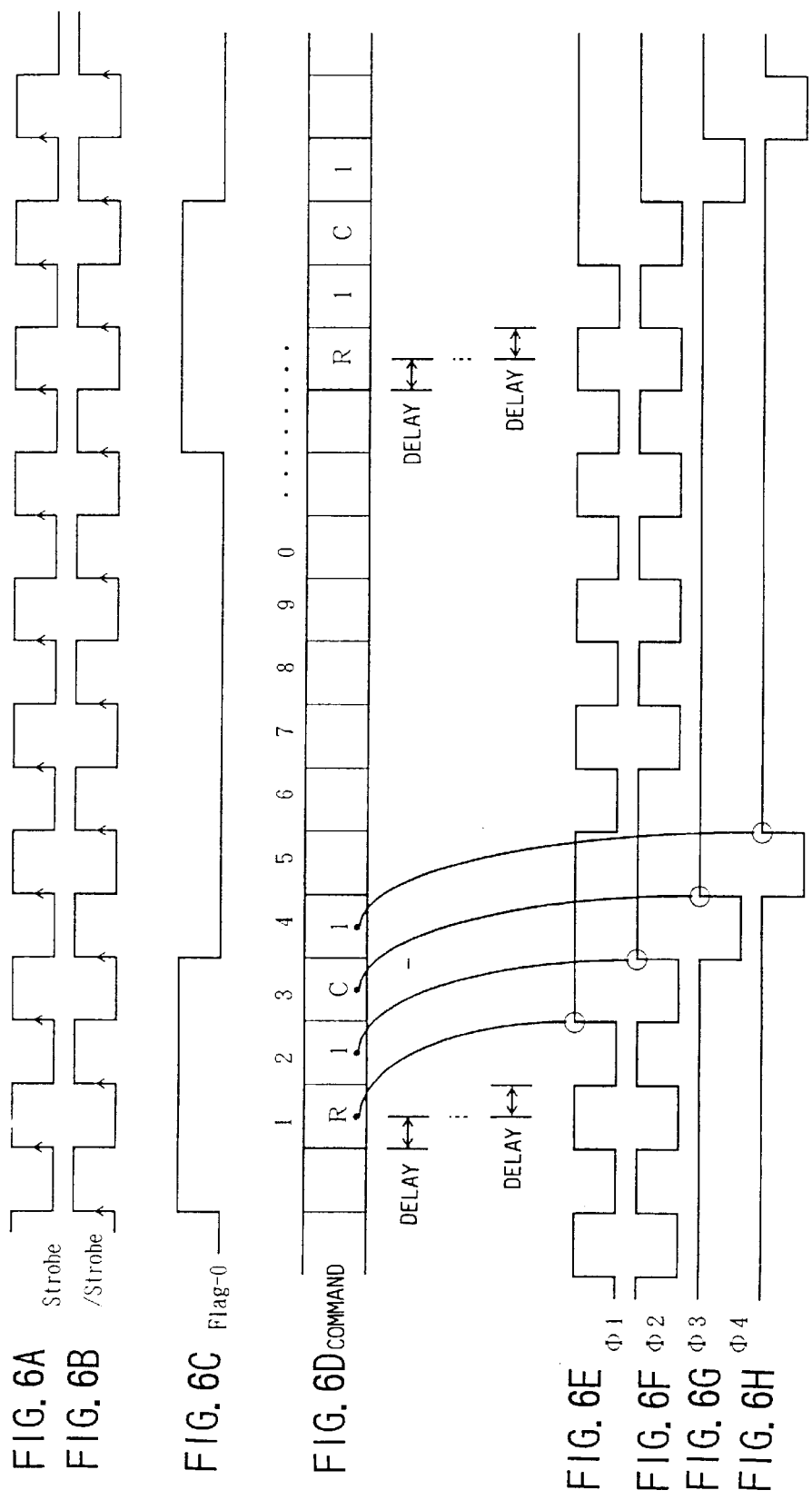

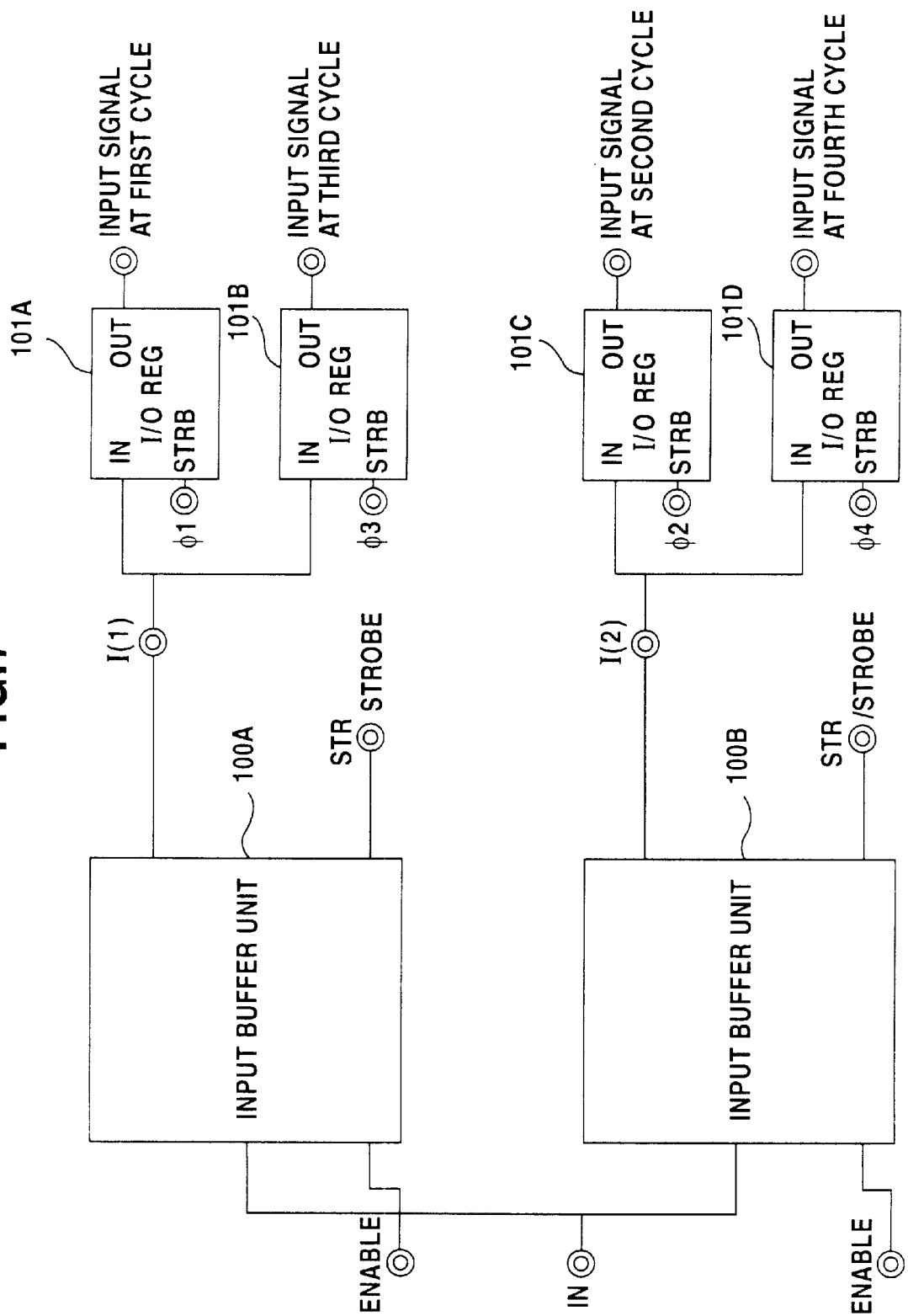

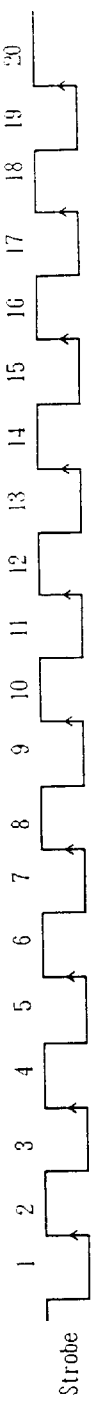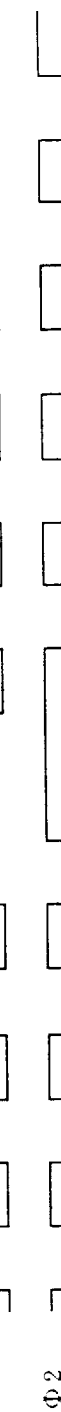
FIG. 9A Strobe
FIG. 9B Flag-0
FIG. 9C A SIGNAL
FIG. 9D B
FIG. 9E C
FIG. 9F D
FIG. 9G E
FIG. 9H Φ1
FIG. 9I Φ2
FIG. 9J Φ3
FIG. 9K Φ4

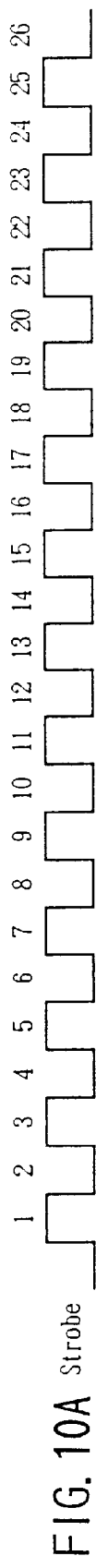
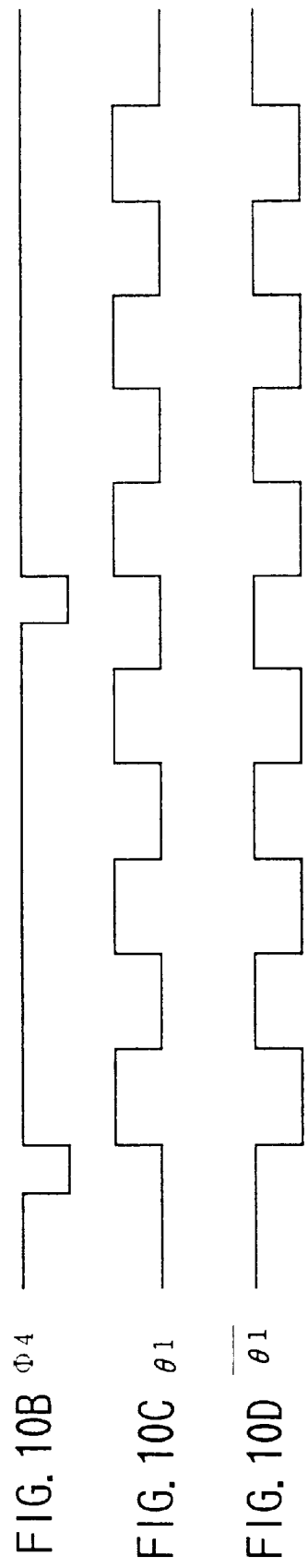
FIG. 10A Strobe
FIG. 10B Φ4
FIG. 10C θ1
FIG. 10D $\overline{θ1}$

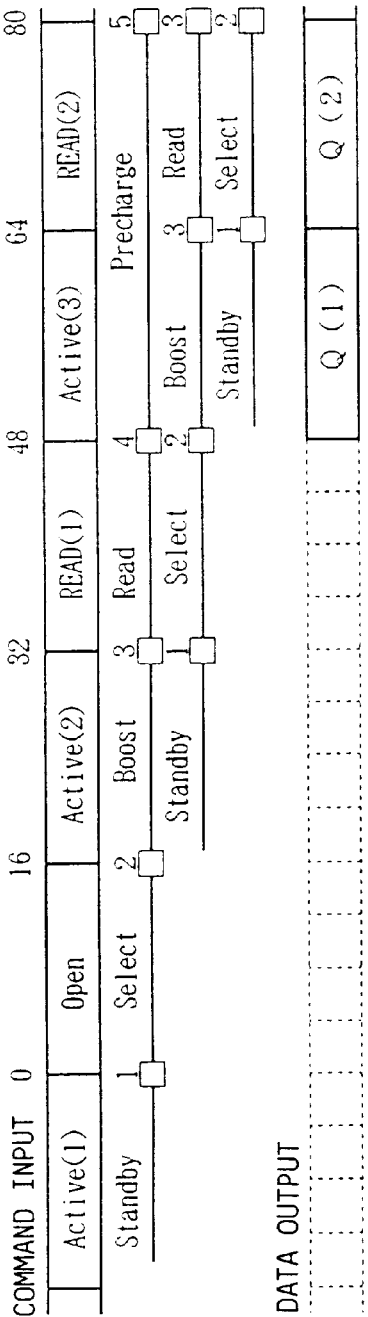
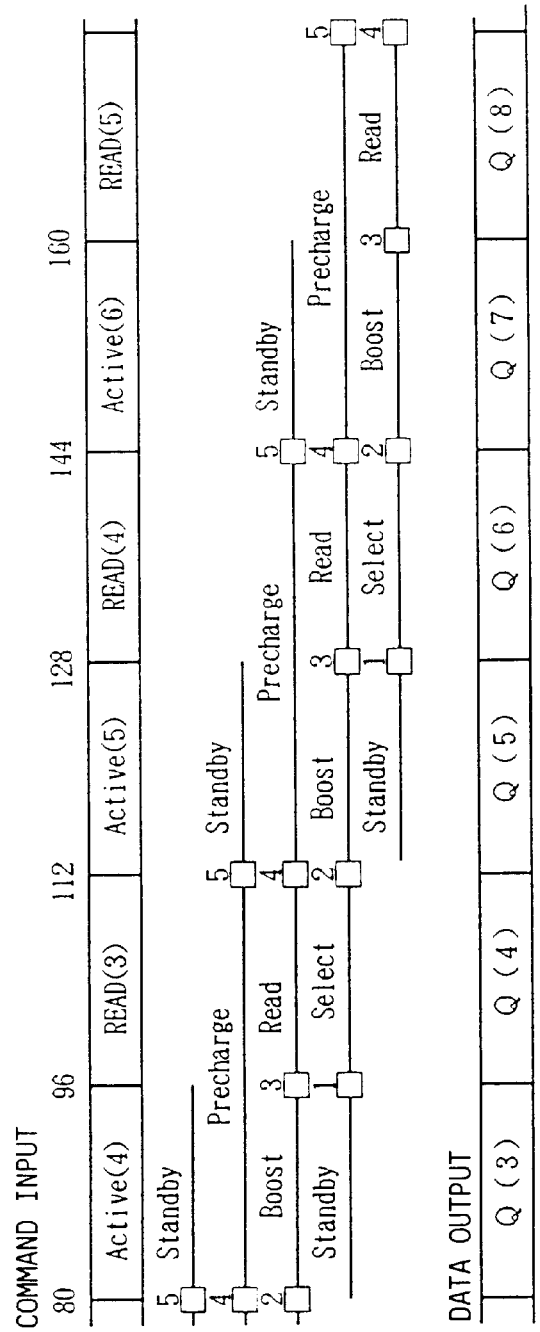

SEMICONDUCTOR MEMORY DEVICE INCLUDING PLURAL BLOCKS WITH A PIPELINE OPERATION FOR CARRYING OUT OPERATIONS IN PREDETERMINED ORDER

BACKGROUND OF THE INVENTION

1. Field of the Invention

The present invention generally relates to pipeline-operation devices, and particularly relates to a memory device carrying out pipeline operations.

2. Description of the Prior Art

As a foundation of an information society, DRAM (dynamic random access memory) chips are widely used because of their capacity to allow integrated circuits to be manufactured in high density. In order to boost speed of data-read/write operations, DRAMs are typically provided with various functions contrived for the purpose of speed enhancement, an example of such functions being a page mode. With an aim of achieving high-speed data transfer, also, SDRAM (synchronous DRAM) is created as a variation of DRAMs to carry out data-read/write operations in synchronism with a clock-signal.

FIGS. 1A and 1B are time charts showing a data-read timing of a conventional DRAM operating in the page mode. FIGS. 1C through 1E are time charts showing a data-read timing of an SDRAM operating in a burst mode.

In the DRAM page mode as shown in FIG. 1A, a plurality of column addresses CA1, CA2, CA3, and CA4 are provided during a single cycle between an input of a given row address RA1 and an input of a next row address RA2. As shown in FIG. 1B, four pieces of data Q1, Q2, Q3, and Q4 in this case can be read out at 20-nanoseconds (ns) intervals, for example, as long as these pieces of data are stored in the same row address. When data is stored in consecutive addresses or in the same row address, use of the page mode is highly effective.

In the SDRAM burst mode as shown in FIG. 1D, a first column address CA1 is provided in synchronism with a clock signal CLK (FIG. 1C) during one cycle between an input of a given row address RA1 and an input of a next row address RA2, and column addresses following the first column address CA1 are internally generated in the memory chip. As shown in FIG. 1E, data pieces Q1, Q2, Q3, and Q4 are continuously read from the memory at high speed in synchronism with the clock signal CLK, as long as these data pieces are stored in the same row address. Similar to the requirements of the DRAM page mode, the SDRAM burst mode achieves a high-speed-data-read operation only when data addresses are continuous or have the same row address.

The DRAM page mode of FIG. 1A and the SDRAM burst mode of FIG. 1D have the same cycle period between successive row-address inputs as that of DRAMs operating in the normal mode. Because of this, the use of the SDRAM or the DRAM page mode can achieve only a data-read speed as fast as that of the normal mode when the data-read addresses are random rather than in the same row address.

DRAMs require a sequence of operations to be conducted within one cycle period between successive row accesses, such sequence including precharging bit-lines (column addresses) to get the bit-lines ready, selecting a word-line (row address) to transfer data to a sense amplifier, and selecting a bit-line to read the data. Because of such a long sequence, the cycle of the row accesses becomes as much as about 100 ns. In other words, since DRAMs require the precharging of bit-lines prior to each data-read operation, consecutive data-read operations are difficult to achieve when read-data addresses are random.

In order to overcome this difficulty, a memory may be divided into a plurality of banks. In principle, this is the same as providing a plurality of memory chips of the same type. With N banks provided, random data access should end up accessing a bank different from the one accessed immediately before at a probability of (N−1)/N. Each bank other than the bank accessed immediately before is already precharged and ready, so that consecutive data-read/write operations can be achieved by accessing different banks one after another.

In such a memory-bank method, however, each bank should be provided with a dedicated set of control circuits while only one of such a set is normally required for a whole memory device. This means that an increase in the bank number leads to an enlargement in the chip size.

Accordingly, there is a need for a memory device which allows address accesses to be consecutively made at high speed by providing a plurality of memory blocks capable of identical operations without enlarging the chip size.

SUMMARY OF THE INVENTION

Accordingly, it is a general object of the present invention to provide a memory device which can satisfy the need described above.

It is another and more specific object of the present invention to provide a memory device which allows address accesses to be consecutively made at high speed by providing a plurality of memory blocks capable of identical operations without enlarging the chip size.

In order to achieve the above objects, a device according to the present invention includes a plurality of blocks, each being capable of carrying out different types of operations, and a control unit for selecting one block after another from the plurality of blocks. In this device, each selected block upon a selection thereof starts carrying out the operations in a predetermined order in a pipe-line operation such that every one of the operations is in progress in one of the blocks at a given time. Here, the terminology "block" represents a core circuit having an array of repeated structures, an example of which is an array of cells sharing a set of sense amplifiers in DRAMs. Alternately, such a block is a unit of repetition in terms of a layout such as a set of several cell-array blocks, or is a bank in terms of an address logic.

In the device described above, the control unit for selecting a block is shared by the plurality of blocks so that there is no need to provide a complex controlling mechanism for each of the blocks. In addition, while a given block is carrying out a given operation, another block which has already finished this given operation can carry out a next operation following the given operation. In this manner, the blocks as a whole perform predetermined operations in a pipe-line manner, thereby achieving high-speed processing.

According to one embodiment of the present invention, each block includes a unit for selecting one operation after another so as to carry out the operations in the predetermined order. Because of this feature, the control unit only selects one block after another to achieve the pipe-line operation.

According to another embodiment of the present invention, the control unit includes a unit for selecting one operation after another in the predetermined order and for instructing each selected block at every turn to carry out a selected one of the operations. Because of this feature, each block only performs an instructed operation to achieve the pipe-line operation.

According to one embodiment of the present invention, the control unit includes a unit for detecting a disturbance in the pipe-line operation so that each selected block delays carrying out the operations. Because of this feature, even when the pipe-line operation is disturbed, all the required operations can be carried out without skipping any one of the operations.

According to one embodiment of the present invention, the control unit includes a unit for detecting a disturbance in the pipe-line operation so that each selected block skips one of the operations causing this disturbance and carries out following ones of the operations. Because of this feature, even when there is a cause to create a disturbance in the pipe-line operation, an operation causing the disturbance is skipped to achieve a smooth pipe-line operation.

According to one embodiment of the present invention, the control unit includes a unit for outputting a signal indicating a detection of a disturbance via the input/output unit. Because of this feature, the control unit can signal the disturbance when an instruction resulting in the disturbance of the pipe-line operation is provided.

According to one embodiment of the present invention, the device is provided with various functions to enhance an input and output interface, such functions including demultiplexing a signal input and multiplexing a signal output based on a supplied strobe signal. Because of these functions, the input and output interface makes an efficient use of a limited number of input/output pins while enhancing the data-output performance.

Other objects and further features of the present invention will be apparent from the following detailed description when read in conjunction with the accompanying drawings.

BRIEF DESCRIPTION OF THE DRAWINGS

FIGS. 4A through 4L are illustrative drawings showing schedules of blocks of the DRAM according to the present invention;

FIGS. 5A and 5B are table charts showing contents of a command/address input;

FIGS. 6A through 6H are time charts showing relations between a Flag-0 input, the command/address input, and other signals;

FIG. 7 is a schematic circuit diagram of a signal input circuit which demultiplexes an input in four-cycle periods;

FIGS. 9A through 9K are time charts showing signals observed at various points in the circuit of FIG. 8;

FIGS. 10A through 10D are time charts showing a strobe signal, the internal clock $\Phi 4$, an internal clock $\theta 1$, and an inverted internal clock/$\theta 1$, respectively;

FIGS. 19A through 19L are illustrative drawings showing schedules of blocks of an SDRAM according to the present invention when the burst length is 1 and the CAS latency is 1;

DETAILED DESCRIPTION OF THE PREFERRED EMBODIMENTS

In the following, a principle and embodiments of the present invention will be described with reference to the accompanying drawings.

Figure 1A:
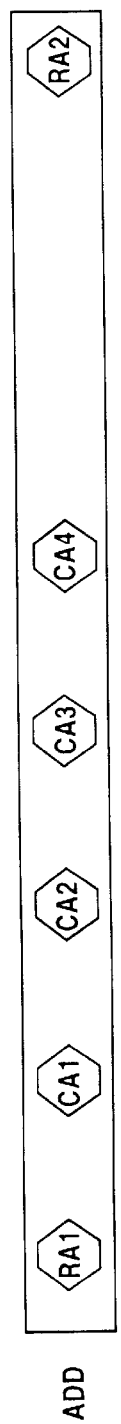
FIGS. 1A and 1B are time charts showing a data-read timing of a conventional DRAM operating in a page mode.
Figure 1B:
Figure 1C:
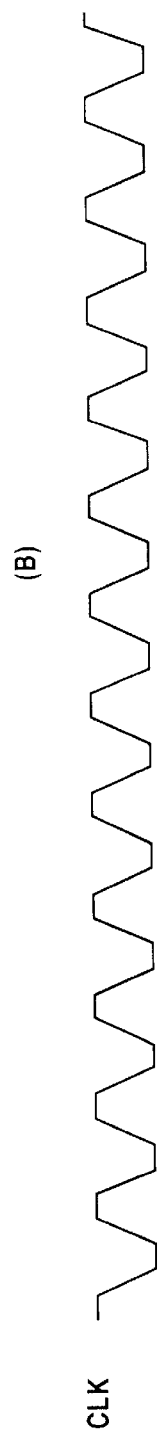
FIGS. 1C through 1E are time charts showing a data-read timing of an SDRAM operating in a burst mode.
Figure 1D:
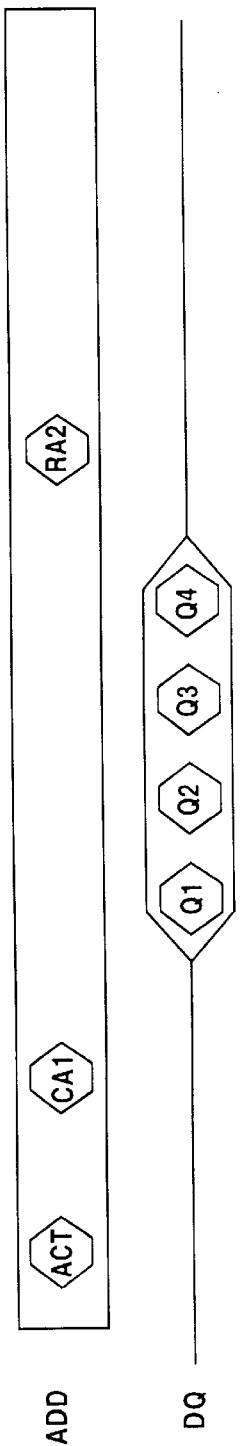
Figure 1E:
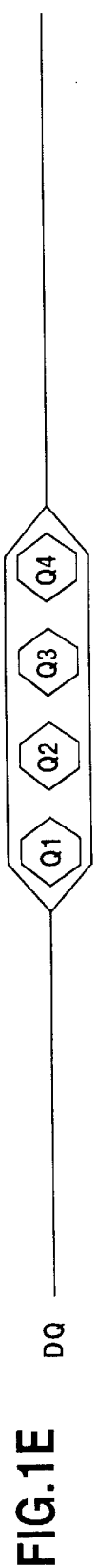
Figure 2A:
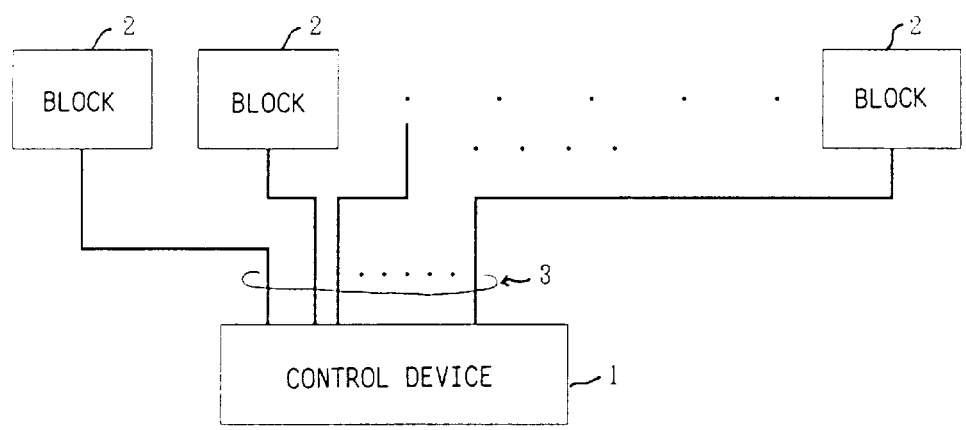
FIGS. 2A and 2B are block diagrams showing configurations of a pipe-line-operation device according to a principle of the present invention.
Figure 2B:
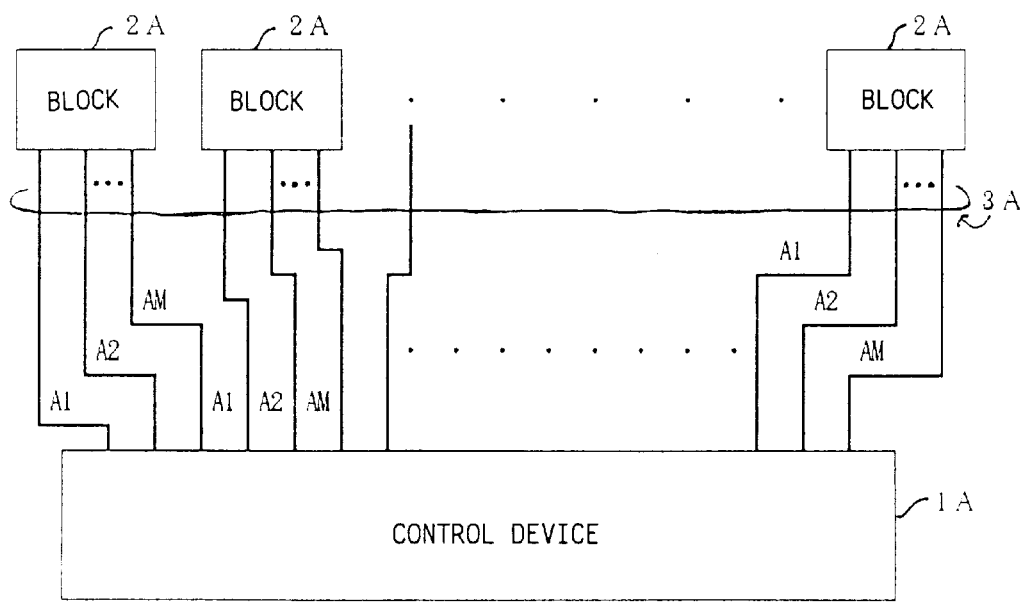

FIGS. 2A and 2B are block diagrams showing configurations of a pipe-line-operation device according to a principle of the present invention.

The pipe-line-operation device of FIG. 2A according to the principle of the present invention includes a control device 1, a plurality of blocks 2, and a control line 3 connecting the control device 1 with each block 2. Each of the blocks 2 carries out M different operations A1 through AM in a predetermined order. The control device 1 selects one of the plurality of blocks 2 via the control line 3. The selected block 2 carries out the M operations in the predetermined order. A time length required by each of the M operations defines one cycle, and the control device 1 selects one block in each cycle from the blocks 2 which are not in operation at the time of the selection. The M operations of the selected block 2 will finish after M cycles, so that the number of the selected blocks 2 simultaneously in operation are M.

By nature of the above operation arrangement, the operation AM, for example, should be being carried out at a given cycle by one of the plurality of blocks 2. Although the operation AM of one block should be preceded by the M−1 operations A1 through AM−1 by the same block, the plurality of the blocks 2 in its entirety can carry out operation AM in each cycle. That is, the plurality of the blocks 2 in its entirety are capable of a pipe-line-like operation.

FIG. 2B shows an alternate example of a pipe-line-operation device according to the principle of the present invention. The pipe-line-operation device of FIG. 2B includes a control device 1A, a plurality of blocks 2A, and M (three in the figure) control lines 3A connecting the control device 1A with each of the blocks 2A. Each of the plurality of blocks 2A carries out the different operations A1 through AM, each operation corresponding to one of the control lines 3A. The control device 1A selects one of the blocks 2A, and uses the control lines 3A to indicate one of the M operations which is to be carried out by the selected block 2A. In this manner, the selected block 2A carries out the indicated operation. A time length required for the indicated operation defines one cycle, and the control device 1A selects one of the M control lines 3A for the selected block 2A in each cycle, such that the selected block 2A carries out the M operations in the predetermined order. Also, the control device 1A selects one new block in each cycle from the blocks 2A which are not in operation at the time of the selection, and makes the newly selected block 2A carry out the M operations in the predetermined order in the same manner as for the already selected blocks 2A. The M operations of the selected block 2A will finish after M cycles, so that the M selected blocks 2A are simultaneously in operation.

Accordingly, in the same manner as in the configuration of FIG. 2A, the operation AM, for example, should be being carried out at a given cycle by one of the plurality of blocks 2A. Although the operation AM of one block should be preceded by the M−1 operations A1 through AM−1 by the same block, the plurality of the blocks 2A in their entirety can carry out the operation AM in each cycle. That is, the plurality of the blocks 2A in their entirety are capable of a pipe-line-like operation.

In the configuration of FIG. 2A, each block 2 should be equipped with a function to carry out the M operations in the predetermined order, but the number of the control lines between the control device 1 and the blocks 2 are fewer than that of FIG. 2B. In FIG. 2B, each block 2A, since it is required to execute only an indicated operation, has a simpler structure than that of the block 2 of FIG. 2A, but the lines connecting the blocks 2A and the control device 1A become complex. Here, the function included in the block 2 of FIG. 2A to execute the M operations in the predetermined order is basically the same as a function provided in the control device 1A of FIG. 2B to control each block 2A to carry out the M operations in the predetermined order. That is, the difference between the configuration of FIG. 2A and the configuration of FIG. 2B is whether to place the function of executing the M operations in the predetermined order in each block or to collectively put this function in the control device.

Figure 3:
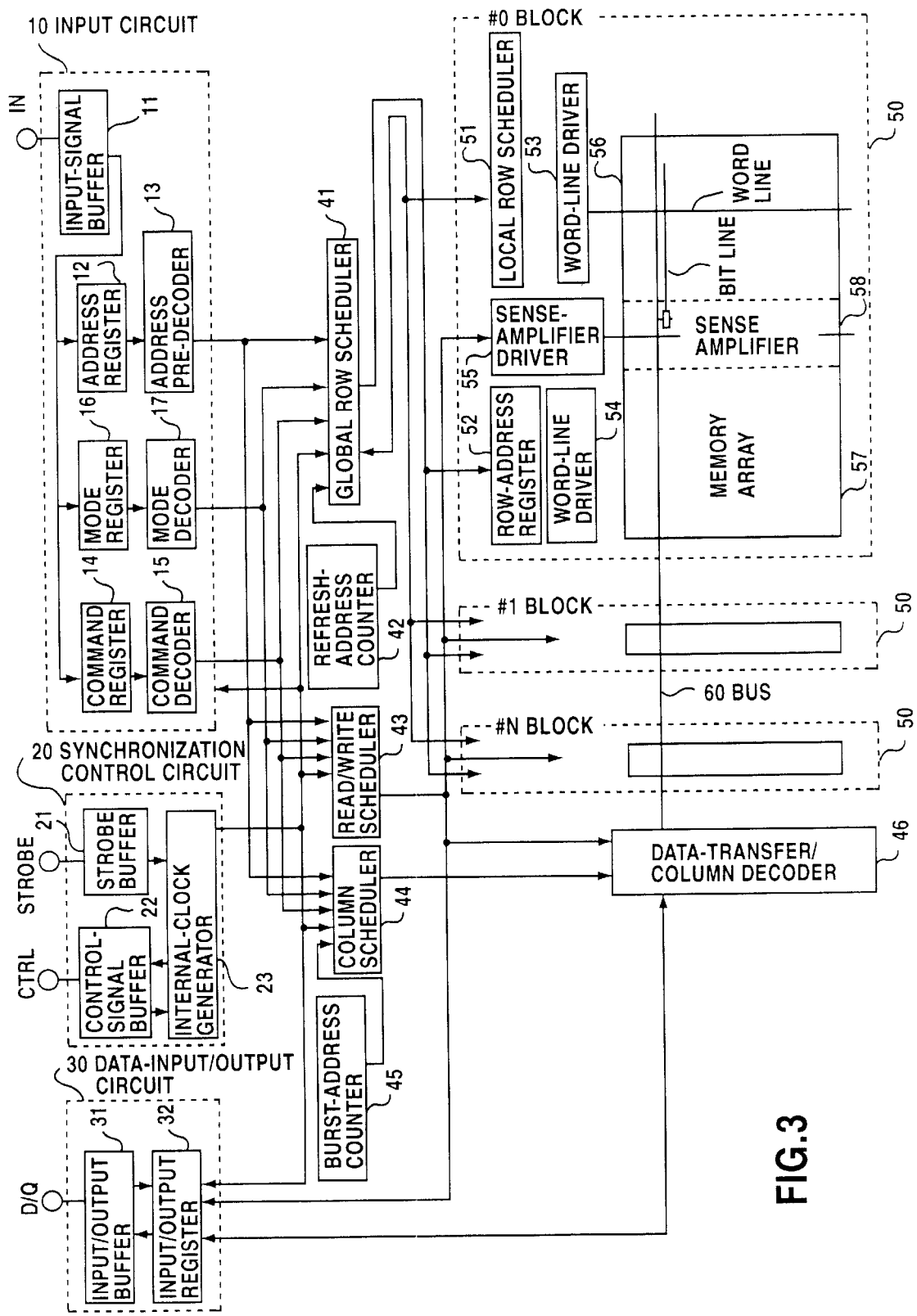
FIG. 3 is a block diagram of DRAM according to a first embodiment of the principle of the present invention.

FIG. 3 is a block diagram of DRAM according to a first embodiment of the principle of the present invention. The embodiment of the DRAM of FIG. 3 corresponds to the configuration shown in FIG. 2A, but can be easily modified to correspond to the configuration of FIG. 2B. The DRAM of FIG. 3 according to the principle of the present invention includes an input circuit 10, a synchronization-control circuit 20, a data-input/output circuit 30, a global row scheduler 41, a refresh-address counter 42, a read/write scheduler 43, a column scheduler 44, a burst-address counter 45, a data-transfer/column decoder 46, and a plurality of blocks 50. In FIG. 3, the global row scheduler 41 corresponds to the control device 1 of FIG. 2A.

The input circuit 10 receives an input signal at a plurality of input nodes IN (only one shown in FIG. 3) of the DRAM. Then, the input circuit 10 extracts, from the input signal, address data regarding an address of a data-read/write operation, and command data regarding a command given to each of the blocks 50. The input circuit 10 includes an input-signal buffer 11 for temporal storage of the input signal, an address register 12, an address pre-decoder 13, a command register 14, a command decoder 15, a mode register 16, and a mode decoder 17.

The address register 12 receives the input signal supplied from the input-signal buffer 11, and extracts a read/write address from the input signal for storage therein. The address pre-decoder 13 decodes the address provided from the address register 12. The command register 14 receives the input signal supplied from the input-signal buffer 11, and extracts a command indicating an operation of each of the blocks 50 to store the command therein. The command decoder 15 decodes the command supplied from the command register 14. The mode register 16 stores mode setting data in order to set an operation latency, a refresh mode, etc., in the same manner as in a conventional DRAM. The mode decoder 17 decodes the mode supplied from the mode register 16.

The address, the mode, and the command sent from the input circuit 10 are supplied to each of the global row scheduler 41, the read/write scheduler 43, and the column scheduler 44. The global row scheduler 41, the read/write scheduler 43, and the column scheduler 44 are shared by the plurality of the blocks 50.

The synchronization-control circuit 20 generates an internal clock based on a strobe signal and a control signal including a flag signal to be described later, where the strobe signal is input to an input node Strobe of the DRAM, and the control signal is input at a control-signal input node CTRL of the DRAM. The synchronization-control circuit 20 includes a strobe buffer 21 for a temporal storage of the strobe signal, a control-signal buffer 22 for a temporal storage of the control signal, and an internal-clock generator 23 for generating internal clocks based on the strobe signal and the control signal. The generated internal clock is supplied to the global row scheduler 41, the input circuit 10, the read/write scheduler 43, the column scheduler 44, and the data-input/output circuit 30.

The data-input/output circuit 30 is responsible for the signal input and the signal output via the data-input/output node D/Q of the DRAM. The data-input/output circuit 30 includes an input/output buffer 31 for a temporal storage of input/output data for data input/output via the data-input/output node D/Q, and an input/output register 32 for storing the input/output data based on the internal clock and the read/write operations.

Each of the blocks 50 is a data storage unit which includes a memory-cell array for storing data, various drivers, a register for storing a row address, and a circuit for controlling executions of various operations in a predetermined order. Each of the blocks 50 includes a local row scheduler 51 for executing each operation of the pertinent block in the predetermined order, a row-address register 52 for storing a supplied row address, word-line drivers 53 and 54 for selecting a word-line indicated by the row address, a sense-amplifier driver 55 for driving a sense amplifier, memory arrays 56 and 57, and a sense amplifier 58. The sense amplifier 58 of each block 50 is connected to a bus 60 which is a shared two-way-communication path. The bus 60 conducts data transfer between the sense amplifier 58 and the data-transfer/column decoder 46.

Every single one of the banks provided in the prior-art SDRAM has the data-transfer/column decoder 46. In the present invention, however, the data-transfer/column decoder 46 and the bus 60 are shared by the plurality of the blocks 50. The difference between the block of the present invention and the bank of the prior-art SDRAM relies on this fact. Because of this fact, the present invention can reduce the chip area size compared to the prior art.

The refresh-address counter 42 generates row addresses one after another when each of the blocks 50 carries out a refresh operation. The generated row addresses are supplied to the global row scheduler 41. The burst-address counter 45 generates column addresses one after another in the burst mode when data is read from consecutive column addresses in the same row address. The generated column address is supplied to the column scheduler 44.

The global row scheduler 41 receives the address and the command from the input circuit 10 and the internal clock from the synchronization-control circuit 20, and makes a schedule of row-address accesses for each of the blocks 50. Namely, the global row scheduler 41 extracts a block address and a row address from the received address, selects one of the blocks 50 indicated by the block address, and instructs the selected one of the blocks 50 to chose a word-line indicated by the row address. Also, the global row scheduler 41 responsive to the received command instructs the selected one of the blocks 50 to execute operations such as a precharge operation, a refresh operation, etc. Such instructions are given in accordance with the command and the internal clock, as will be described later.

The column scheduler 44 receives the address and the command from the input circuit 10 and the internal clock from the synchronization-control circuit 20, and makes a schedule of column-address accesses for each of the blocks 50. Namely, the column scheduler 44 extracts the column address from the received address, and supplies the column address to the data-transfer/column decoder 46. The timing of the provision of the column address is determined based on the command and the internal clock. In this manner, the data-transfer/column decoder 46 can select a sense amplifier connected to a bit-line corresponding to the column address at the time of the data-read/write operation.

The read/write scheduler 43 receives the address and the command from the input circuit 10 and the internal clock from the synchronization-control circuit 20, and makes a schedule of data-read/write operations for each of the blocks 50. Namely, the read/write scheduler 43 extracts the block address from the received address, selects one of the blocks 50 indicated by the block address, and drives the sense-amplifier driver 55 of the selected one of the blocks 50. This timing is determined based on the command and the internal clock. Also, the read/write scheduler 43 notifies the data-transfer/column decoder 46 of the timing of the data-read/write operations.

FIGS. 4A through 4L are illustrative drawings showing schedules of blocks of the DRAM according to the present invention. FIG. 4A shows command inputs, and FIG. 4F is a continuation of FIG. 4A. FIGS. 4B through 4D show operation schedules of blocks 1 through 3, respectively, and FIGS. 4G through 4I are continuations of FIGS. 4B through 4D, respectively. FIGS. 4J and 4K show operation schedules of blocks 4 and 5, respectively. FIG. 4E shows data outputs, and FIG. 4L is a continuation of FIG. 4E.

As shown in FIGS. 4A through 4L, one of the blocks 50 (FIG. 3) selected by the global row scheduler 41 (FIG. 3) can execute one command during four cycles of the clock (strobe) signal. Each block operates such that a state thereof switches once every four cycles. FIGS. 4A through 4L show a case in which the burst length is 4. In this case, 4-bit data is read out at a time in parallel to be converted into serial data, and this operation is executed two times for each block access.

With reference to FIG. 3 and FIGS. 4A through 4L, each block is initially in a ready condition. When the global row scheduler 41 selects one of the blocks 50, the local row scheduler 51 of the selected one of the blocks 50, using a Select/Boost instruction, selects a word-line at a first timing, and transfers data from a memory cell connected to the selected word-line to the sense amplifier 58 at a second timing four cycles after the first timing. At a third timing, the data is read out by a Read-1 instruction. Since the burst length is 2 in this case, data is read out two times consecutively, so that a stream of 8 bits of data read out during 8 cycles of the clock are output as data outputs 1 through 17. The local row scheduler 51 executes a Precharge instruction after the Read instruction. By doing so, bit-lines are precharged, and the selected one of the blocks 50 is back in the ready condition.

The global row scheduler 41 selects one of the blocks 50 one after another at every other timing (8-clock intervals) as shown in FIGS. 4A through 4L. At a given timing, a first block (e.g., block 1) of the blocks 50 executes the Select/Boost instruction. Two timings later, the first block executes the Read instruction, and, at the same time, a second block (block 2) of the blocks 50 is selected to carry out the Select/Boost instruction. After further two timings, the first block executes the Precharge instruction, the second block executes the Read instruction, and a third block (block 3) of the blocks 50 is selected to execute the Select/Boost instruction. In this manner, a different one of the blocks 50 is successively selected to carry out the Select/Boost instruction, the Read instruction, and the Precharge instruction. As a result, the blocks 50 operate as in the pipe-line operation to allow consecutive reading of data.

With reference to FIGS. 4A through 4L, a set of the Read-1 and Read-2 instructions is carried out by only one of the blocks 50 at a given time. This is because the bus 60 and the data-transfer/column decoder 46 are shared by the plurality of the blocks 50 in FIG. 3. Namely, if two or more blocks simultaneously attempt the read operation, competing demands are created for the bus 60 and the data-transfer/column decoder 46 so that a normal operation cannot be guaranteed. In FIGS. 4A through 4L, the blocks 1 through 5 are in operation simultaneously, but only one of these blocks is allowed to carry out the Read instruction at a given time. On the other hand, an operation (e.g., standby operation) for which no competing demand is created by a plurality of blocks is created can be simultaneously executed by more than one block. Depending on data addresses to be accessed, the same block may be selected consecutively. In this case, a continuous pipe-line operation is disturbed (i.e. pipeline is disrupted when the same block is selected consecutively).

Although the schedule of each block shown in FIGS. 4A through 4L has been described with reference to the data-read operation, it is apparent that the data-write operation for the DRAM can be carried out in the same schedule. In this case, a Write instruction replaces the Read instruction to write data in one of the memory arrays 56 and 57 via the sense amplifier 58. In the data-write operation, the Select/Boost operation only selects a word-line without a need to transfer data into the sense amplifier 58.

In each of the blocks 50, a word-line corresponding to the row address supplied at the time of the block selection is chosen. If a row address supplied to a selected one of the blocks 50 was changed to another row address supplied to another one of the blocks 50 before the completion of the data-read operation in the former one of the blocks 50, it would cause a problem. Thus, each of the blocks 50 should be provided with the row-address register 52 serving as a latch for storing a row address supplied thereto. This latch may be provided for each word-line to store a decoded address. Alternately, this latch may be provided as a predecode register for storing an address prior to decoding. Alternately, this latch may be provided as a register to store an address of an intermediate representation.

The DRAM chip according to the present invention receives a 16-bit command/address input at the node IN of FIG. 3. This command/address input is provided at the time when a flag signal Flag-0 input to the CTRL node of the chip is at a high level. The command/address input is demultiplexed in synchronism with the strobe signal during the high level of the flag signal Flag-0 to be broken into four different contents.

FIGS. 5A and 5B are table charts showing the four contents of the command/address input. As shown in FIG. 5A, the command/address input contains a device ID, a bank address, and a command during a first cycle of the strobe signal (Strobe). During a second cycle of the strobe signal, the command/address input includes the row address and the block address. Further, the column address is provided in the command/address input during a third cycle of the strobe signal. The command/address input during the last and fourth cycle of the strobe signal is not currently used.

FIG. 5B shows details of the command which is defined by bits 8 through 15 of the command/address input during the first cycle. As shown in FIG. 5B, for example, the bit 1 being "1" indicates the refresh operation, the bit 2 being "1" indicates the selection of a word-line, and the bits 4 through 6 specify a burst length. In this manner, the command specified by a bit pattern defines an operation of one of the blocks 50. Namely, the command specified by the bit pattern is supplied to one of the blocks 50 indicated by the block address, in a bank indicated by the bank address, in the device indicated by the device ID, as shown in the command/address input of FIG. 5A. In response, one of the blocks 50 carries out the Select\Boost instruction, the Read instruction, the Precharge instruction, etc., at the predetermined timing according to the supplied command indicating the 8-burst operation, the 16-burst operation, or the like.

FIGS. 6A through 6H are time charts showing relations between the Flag-0 input, the command/address input, and other signals. The Flag-0 signal and the command/address input are supplied to the chip in synchronism with the strobe signal input to the chip, as shown in FIGS. 6A through 6D. The command/address input is comprised of 4 cycles of the input strobe signal (see FIG. 5A), and is read by the chip using a rising edge of the flag signal Flag-0 as read-start timing. Here, in the present invention, ½ cycle of the input strobe signal is used in actuality as one cycle of this reading operation for convenience. In FIGS. 6A through 6D, the command address input is provided with a delay by one cycle (½ cycle of the strobe signal) compared to the flag input. This is because the flag signal needs to be input ahead of the command/address input.

FIG. 7 is a schematic circuit diagram of a signal input circuit which demultiplexes the input in the four-cycle periods. In FIG. 7, a node IN corresponds to one bit of the command/address input. Namely, the node IN receives (one bit of) the command/address input completed in 4 cycles in synchronism with the input strobe signal as shown in FIGS. 6A and 6D.

The signal input circuit of FIG. 7 includes an input-buffer unit 100A, an input-buffer unit 100B, and input registers 101A through 101D. Each of the input-buffer unit 100A and the input-buffer unit 100B latches data supplied at the node IN at the time when a signal supplied to a node STR has a rising edge (node ENABLE should be active). That is, the input-buffer unit 100A holds the input signal supplied to the node IN at the rising edge of the strobe signal Strobe, and the input-buffer unit 100B holds the input signal supplied to the node IN at the rising edge of the inverse-strobe signal /Strobe. (The symbol "/" placed before a signal symbol represents the inverse of the signal.) That is, the input-buffer unit 100A latches the input signal at odd-number cycles of the strobe signal Strobe, and the input-buffer unit 100B latches the input signal at even-number cycles of the strobe signal. Here, the strobe signal Strobe is HIGH at the odd-number cycles and LOW at the even-number cycles as shown in FIGS. 6A and 6D.

The input registers 101A through 101D receive internal clocks $\Phi1$, $\Phi2$, $\Phi3$, and $\Phi4$ of FIGS. 6E through 6H, respectively, as strobe inputs, and latch the signal stored in the input-buffer unit 100A or the input-buffer unit 100B. Here, each of the input registers 101A through 101D latches the input data when the strobe signal becomes HIGH. Namely, as shown in FIGS. 6D through 6H, the command/address input at the odd-number cycles are read by the input registers 101A and 101B by using $\Phi1$ and $\Phi3$, respectively, and the command/address input at the even-number cycles are read by the input registers 101C and 101D by using $\Phi2$ and $\Phi4$, respectively.

The internal clock $\Phi4$ is also used as a signal for indicating a start timing of operations to internal circuits in the DRAM chip. Namely, when this signal is activated, the internal circuits such as the global row scheduler 41, etc., start operations.

Figure 8:
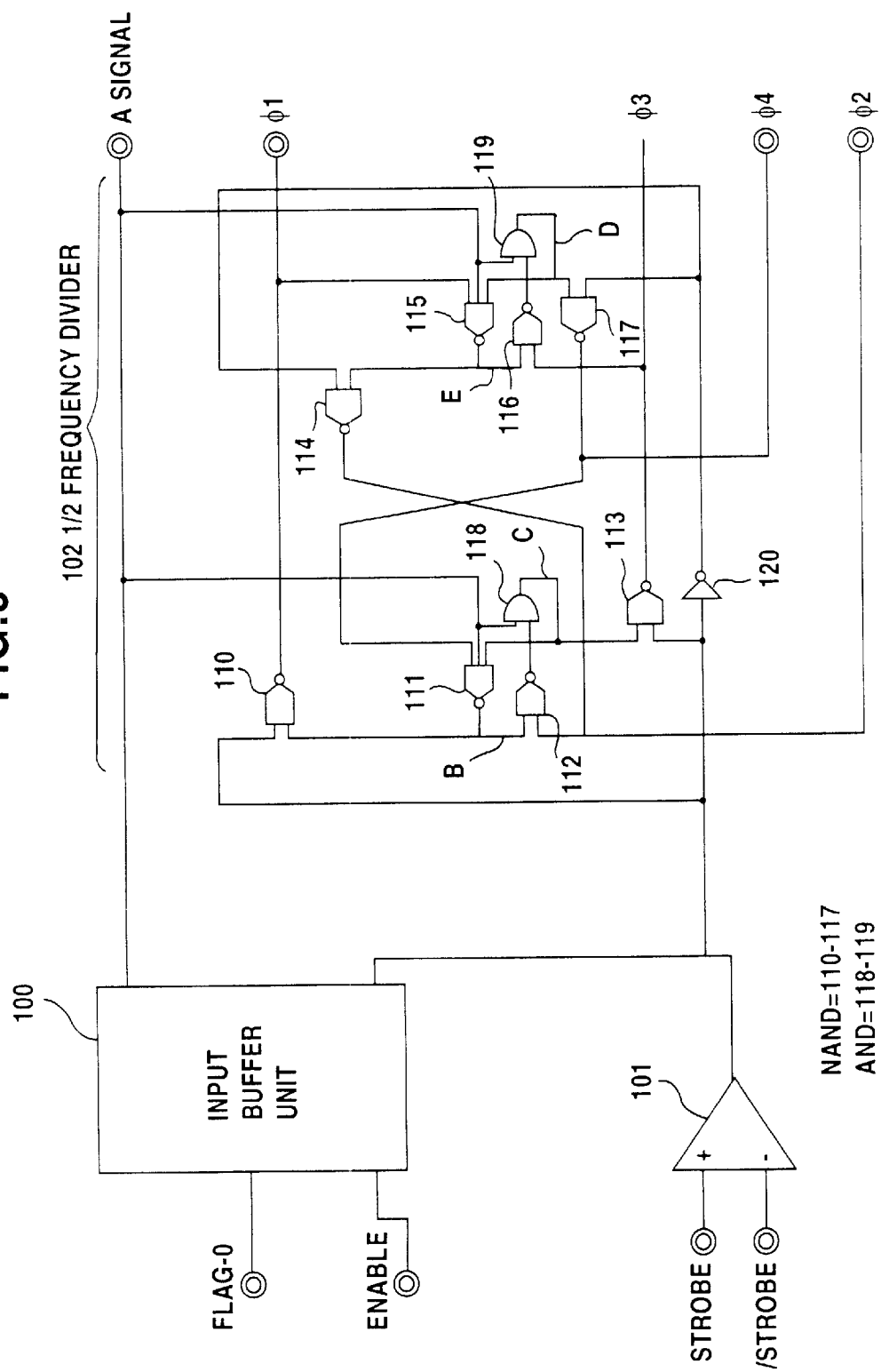
FIG. 8 is a circuit diagram of an internal-clock-generation circuit which generates internal clocks $\Phi 1$, $\Phi 2$, $\Phi 3$, and $\Phi 4$ used in the DRAM chip of the present invention.

FIG. 8 is a circuit diagram of an internal-clock-generation circuit which generates the internal clocks $\Phi1$, $\Phi2$, $\Phi3$, and $\Phi4$ used in the DRAM chip of the present invention. FIGS. 9A through 9K are time charts showing signals observed at various points in the circuit of FIG. 8.

The internal-clock-generation circuit of FIG. 8 includes an input-buffer unit 100, a strobe-buffer unit 101, and a ½ frequency divider 102. The input-buffer unit 100 is the same circuit as the input-buffer unit 100A or the input-buffer unit 100B, and latches an input signal (Flag-0) at a rising edge of the strobe signal Strobe when the Enable signal is HIGH. An internal structure of the input-buffer unit 100 is well within a range of ordinary skill in the art, and a description thereof will be omitted. As shown in FIG. 8 and FIG. 9C, an A signal from the input-buffer unit 100 is a signal obtained by latching the signal Flag-0 at the rising edge of the strobe signal Strobe.

The ½ frequency divider 102 generates the internal clocks $\Phi1$, $\Phi2$, $\Phi3$, and $\Phi4$ as shown in FIGS. 9H through 9K based on the signal A and the strobe signal Strobe. As shown in FIG. 8, the ½ frequency divider 102 includes NAND circuits 110 through 117, AND circuits 118 and 119, and an inverter 120.

In the ½ frequency divider 102, when the input A signal is LOW, a signal at a point B of an output of the NAND circuit 111 is HIGH at all times. Thus, the NAND circuit 110 functions as an inverter for the strobe input signal to generate an inverted strobe signal as a $\Phi1$ output. Also, with the input A signal being LOW, a signal at a point E of an output of the NAND circuit 115 is always HIGH. The NAND circuit 114 in this case serves as an inverter for the inverted strobe signal which is inverted by the inverter 120, and, thus, the strobe signal is returned to its original phase to be output as a signal $\Phi2$. Since one of the inputs to the AND circuit 118 is LOW (the A signal), a signal at a point C is LOW at all times, with a signal Φ3 output from the NAND circuit 113 remaining at HIGH. Likewise, when one of the inputs to the AND circuit 119 is LOW (the A signal), a signal at a point D is always LOW, so that a signal Φ4 output from the NAND circuit 117 remains at HIGH.

In the ½ frequency divider 102, when the input A signal is HIGH, the AND circuit 118 and the AND circuit 119 can be ignored since they pass the other input without any change. In this case, a set of the NAND circuit 111 and the NAND circuit 112 functions as a flip-flop FF1, and a set of the NAND circuit 115 and the NAND circuit 116 functions as a flip-flop FF2. Behaviors of the signals Φ1 through Φ4 when the A signal is HIGH will be described below.

First, signals B, C, D, and E shown in FIGS. 9D through 9G from which the signals Φ1, Φ2, Φ3, and Φ4 are generated will be described. Immediately after the A signal becomes HIGH (at cycle 6), two inputs to the flip-flop FF1, i.e., the NAND-circuit-114 output (Φ2) and the NAND-circuit-117 output (Φ4), are HIGH. Thus, the B signal and the C signal from the flip-flop FF1 do not change unless either of these two inputs to the flip-flop FF1 becomes LOW. One of these two inputs, the NAND-circuit-114 output (Φ2), becomes LOW when the strobe signal turns to LOW. When this happens, the B signal and C signal become LOW and HIGH, respectively. Once the flip-flop FF1 is put into this state, the state of the flip-flop FF1 does not change unless the NAND-circuit-117 output (Φ4), which is the HIGH input to the flip-flop FF1, changes to LOW.

Immediately after the A signal becomes HIGH (at cycle 6), two inputs to the flip-flop FF2, i.e., the NAND-circuit-110 output (Φ1) and the NAND-circuit-113 output (Φ3), are LOW and HIGH, respectively. Thus, the D signal and the E signal from the flip-flop FF2 do not change unless the HIGH input, i.e., the NAND-circuit-113 output (Φ3), becomes LOW. The NAND-circuit-113 output (Φ3) becomes LOW when both the C signal and the strobe signal become HIGH. When this happens, the NAND-circuit-110 output (Φ1) is also HIGH, so that the D signal and the E signal becomes HIGH and LOW, respectively. Accordingly, as shown in FIGS. 9F and 9G, the D signal and the E signal are changed one cycle after the changes of the B signal and the C signal. When the flip-flop FF2 is in this state, the state of the flip-flop FF2 does not change unless the NAND-circuit-110 output (Φ1), which is the HIGH input to the flip-flop FF2, changes to LOW.

In order to bring about a state change in the flip-flop FF1, the NAND-circuit-117 output (Φ4), which is one of the inputs to the flip-flop FF1, needs to become LOW as mentioned above. The NAND-circuit-117 output (Φ4) becomes LOW when the strobe signal changes to LOW (at cycle 9) since the D signal is HIGH. When this happens, the other input to the flip-flop FF1, i.e., the NAND-circuit-114 output (Φ2), is HIGH, so that the state of the flip-flop FF1 is inverted to turn the B signal and the C signal into HIGH and LOW, respectively.

In order to bring about a state change in the flip-flop FF2, the NAND-circuit-110 output (Φ1), which is one of the inputs to the flip-flop FF2, needs to become LOW as mentioned above. The NAND-circuit-110 output (Φ1) becomes LOW when the strobe signal changes to HIGH (at cycle 10) since the B signal is HIGH. When this happens, the other input to the flip-flop FF2, i.e., the NAND-circuit-113 output (Φ3), is HIGH, so that the state of the flip-flop FF2 is inverted to turn the D signal and the E signal into LOW and HIGH, respectively.

By the time when the D signal and the E signal become LOW and HIGH, respectively, and the flip-flop FF2 is back in its original state, the A signal is already back to LOW. When the A signal again becomes HIGH at a later time, the same operation as described above will be repeated. If the A signal were to remain HIGH at the cycle 10 and thereafter, the B signal and the C signal would be inverted at cycle 11, and the E signal and the D signal would be inverted at cycle 12 to repeat the same operation as described above. Accordingly, when the A signal remains HIGH, the signals Φ1 through Φ4 become LOW every four cycles in a staggered manner.

Having described the command/address input, the demultiplexing of the command/address input, and the generation of the internal clocks, configurations and operations of the global row scheduler 41, the column scheduler 44, and the local row scheduler 51 of FIG. 3 will be described below in detail.

First, an internal clock θ1 which is used for synchronizing the operations of the global row scheduler 41, the column scheduler 44, and the local row scheduler 51 will be described. FIGS. 10A through 10D are time charts showing the strobe signal, the internal clock Φ4, an internal clock θ1, and an inverted internal clock /θ1, respectively. As previously described, the operations of the global row scheduler 41, etc., are started by using the signal Φ4 of FIG. 6H as a start signal. As shown in FIGS. 10A through 10D, the internal clock θ1 switches between HIGH and LOW every two cycles one cycle after the signal Φ4 changes to LOW.

In this first embodiment of the present invention, each of the blocks 50 changes its operation state every four cycles, so that the signal θ1 has a period matching with the timing of the operation-state transition. That is, this signal θ1 can be used as the internal clock for operating the global row scheduler 41, the column scheduler 44, and the local row scheduler 51. The signal θ1 can be generated based on the strobe signal Strobe and the signal Φ4 (or Φ3 or the like) by using knowledge well within the ordinary skill in the field, and a description of a circuit for generating the signal θ1 will be omitted.

Figure 11:
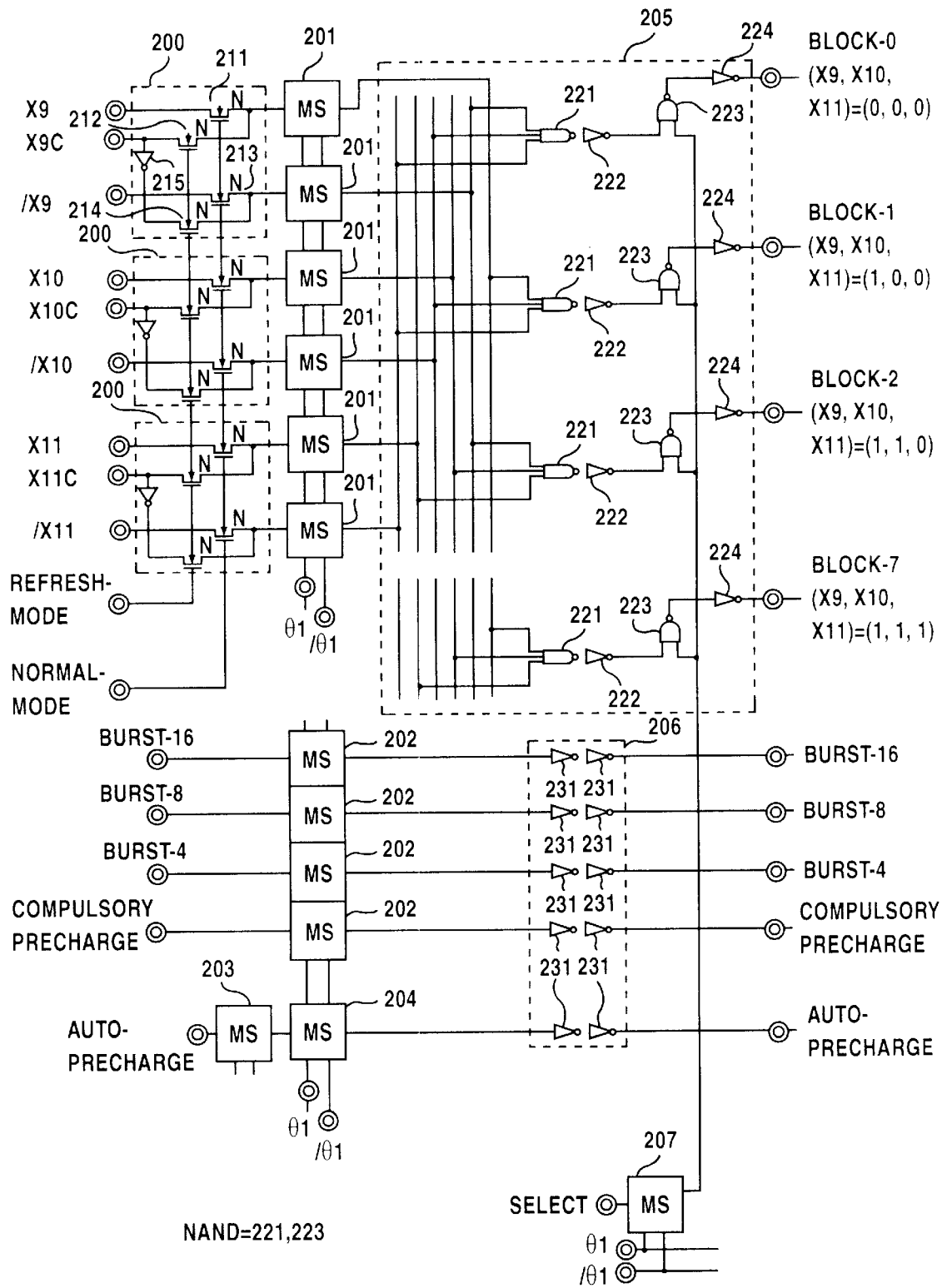
FIG. 11 is a circuit diagram showing a partial configuration of the global row scheduler of FIG. 3.
Figure 12:
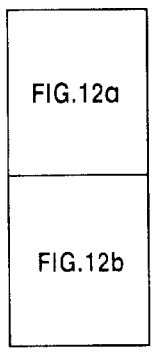
FIG. 12 is a circuit diagram showing a partial configuration of the global row scheduler of FIG. 3.
Figure 12A:
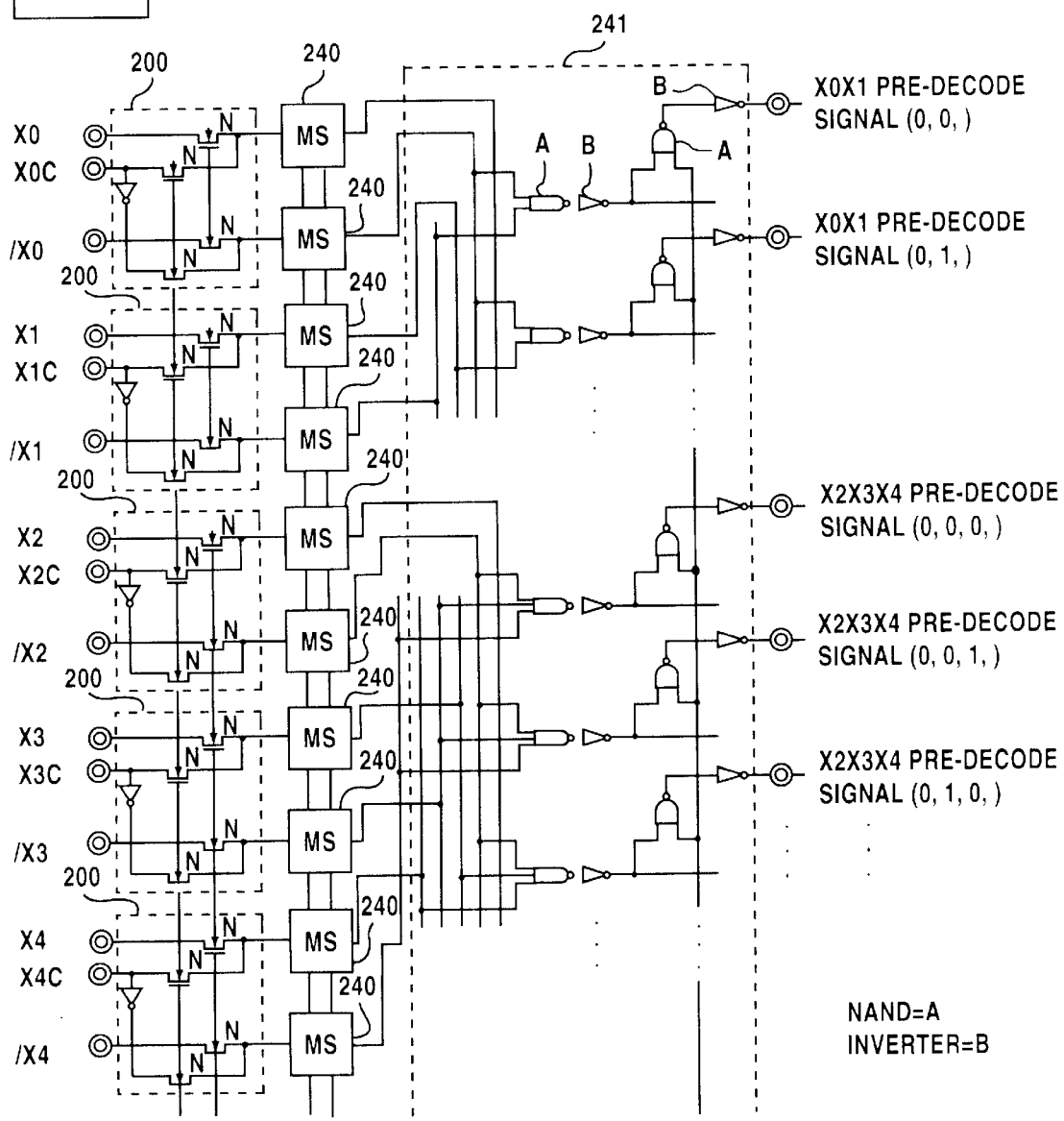
Figure 12B:
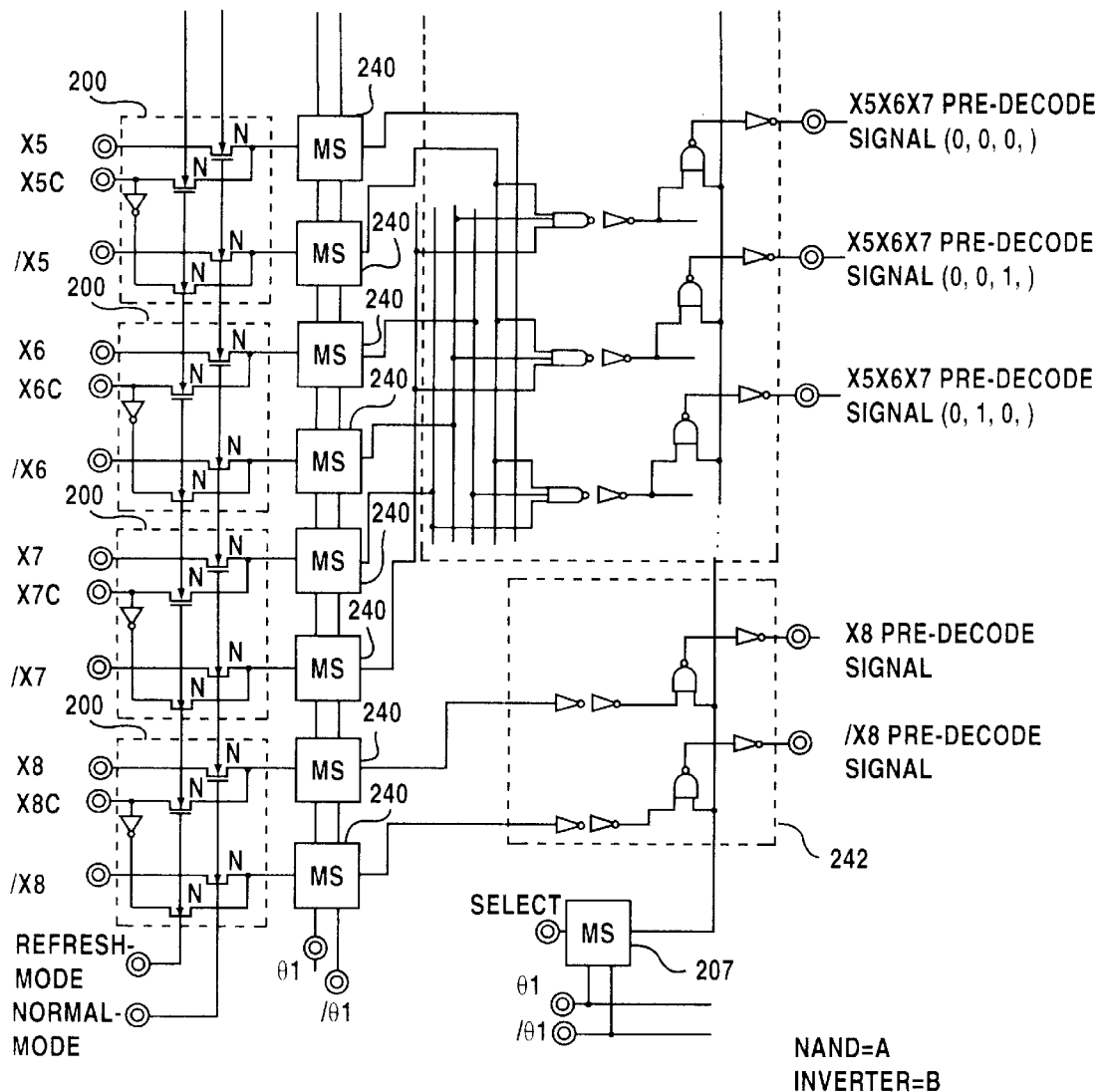

FIG. 11 and FIG. 12 are circuit diagrams showing a configuration of the global row scheduler 41. FIG. 11 shows a part which selects one of the blocks 50 and specifies a burst length, etc., for the selected one of the blocks 50. FIG. 12 shows a part which selects a row address for the selected one of the blocks 50.

As shown in FIG. 11, the global row scheduler 41 includes a plurality of block-selection MS (master-slave) flip-flops 201, a plurality of command MS flip-flops 202, auto-precharge MS flip-flops 203 and 204, a decoding unit 205, a driving unit 206, and a signal-output-timing MS flip-flop 207.

The mode-selection circuits 200 receive the decoded refresh-mode signal, the decoded normal-mode signal, etc., from the mode decoder 17 of FIG. 3, and, also, receive address signals X9, /X9, . . . , X11, and /X11 for selecting one of the blocks 50 from the address pre-decoder 13. Also, the mode-selection circuits 200 receive address signals X9C, X10C, and X11C for selecting one of the blocks 50 at the time of the refresh operation from the refresh-address counter 42. Each of the mode-selection circuits 200 includes NMOS transistors 211 through 214 and an inverter 215. One of the mode-selection circuits 200 for receiving the address signal X9, for example, supplies an inverted address signal /X9C to one of the block-selection MS flip-flops 201 when the refresh-mode signal is ON, and supplies address signals X9 and /X9 to the corresponding block-selection MS flip-flops 201 when the normal-mode signal is ON.

The block-selection MS flip-flops 201 latch the supplied data by using the internal clock θ1 and the inverted internal clock /θ1. Output signals from the block-selection MS flip-flops 201 for selecting one of the blocks 50 are supplied to the decoding unit 205.

The decoding unit 205 includes a plurality of NAND circuits 221, a plurality of NAND circuits 223, a plurality of inverters 222, and a plurality of inverters 224. The decoding unit 205 receives the Select signal from the signal-output-timing MS flip-flop 207, and outputs a selection signal for the blocks 50 when the Select signal is HIGH. When (X9, X10, X11) is (1, 1, 0), for example, only a selection signal supplied to a third one of the blocks 50 becomes HIGH.

Each of the command MS flip-flops 202 receives a signal indicating a burst type, a signal indicating a compulsory precharge, or the like from the command decoder 15, and latches the received signal. The latched signal is supplied to each of the blocks 50 via the driving unit 206 comprised of inverters 231.

The auto-precharge MS flip-flop 203 receives a signal indicating an auto-precharge from the command decoder 15, and latches the received signal. The latched signal is supplied to each of the blocks 50 via the driving unit 206 after a further latch by the auto-precharge MS flip-flop 204 for the timing adjustment.

In this manner, the global row scheduler 41 supplies the selection signal and the command for indicating an operation to the selected one of the blocks 50.

As shown in FIG. 12, the global row scheduler 41 further includes a plurality of mode-selection circuits 200, a plurality of row-address-selection MS flip-flops 240, a decoding unit 241, and a row-address-selection gate unit 242.

The row-address-mode-selection circuits 200 are the same circuits as the mode-selection circuits 200 of FIG. 11, and receive a signal for indicating a mode, address signals X0 through X8 and /X0 through /X8 for indicating a row address, and address signals X0C through X8C for indicating a refresh-mode row address. Then, the row-address-mode-selection circuits 200 select appropriate address signals matching with the indicated mode. The row-address-selection MS flip-flops 240 latch the signals from the row-address-mode-selection circuits 200 by using the internal clock θ1 and the inverse internal clock /θ1. The decoding unit 241 is a circuit of the same type as the decoding unit 205 of FIG. 11, and decodes address signals from the row-address-selection MS flip-flops 240 to output a decoded address signal. This decoded address signal is output for one cycle after the input of the Select signal. The row-address-selection gate unit 242 outputs the most significant bit X8 of the row address and the most significant bit /X8 of the inverted row address for one cycle after the input of the Select signal.

In this manner, the global row scheduler 41 supplies to the selected one of the blocks 50 the row address in addition to the selection signal and the command for indicating the operation.

Figure 13:
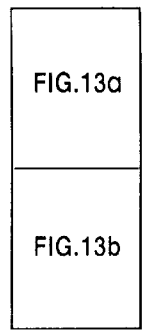
FIG. 13 is a circuit diagram of the column scheduler of FIG. 3.
Figure 13A:
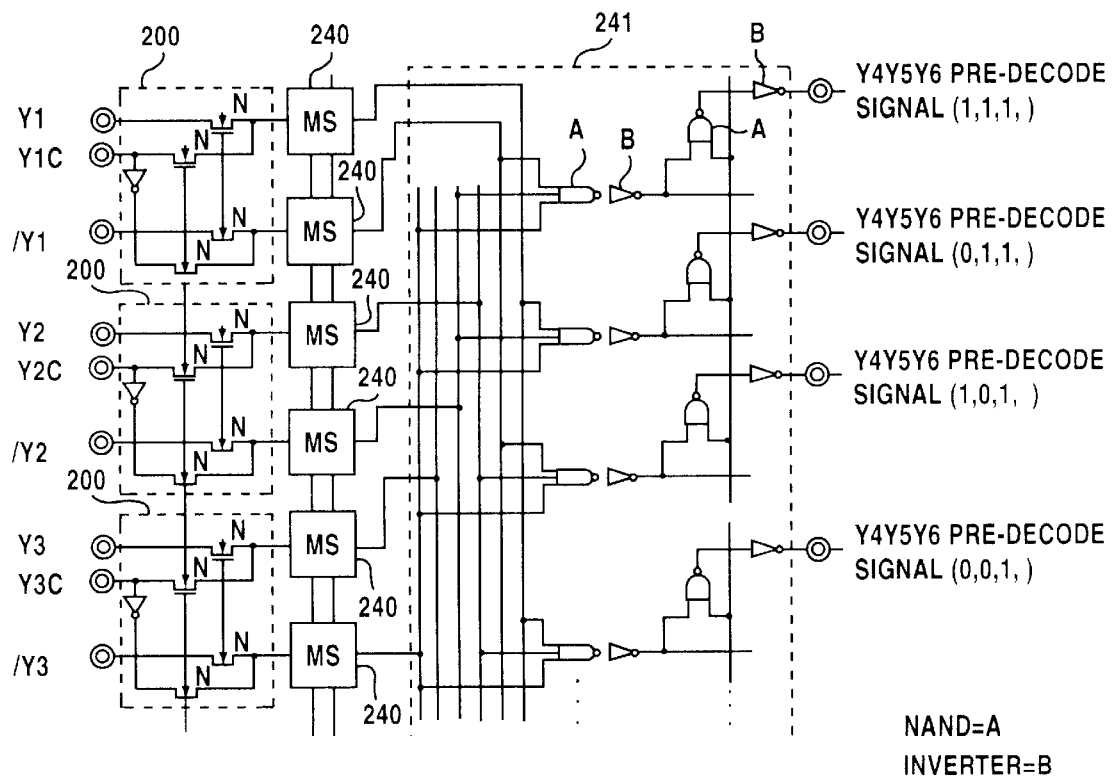
Figure 13B:
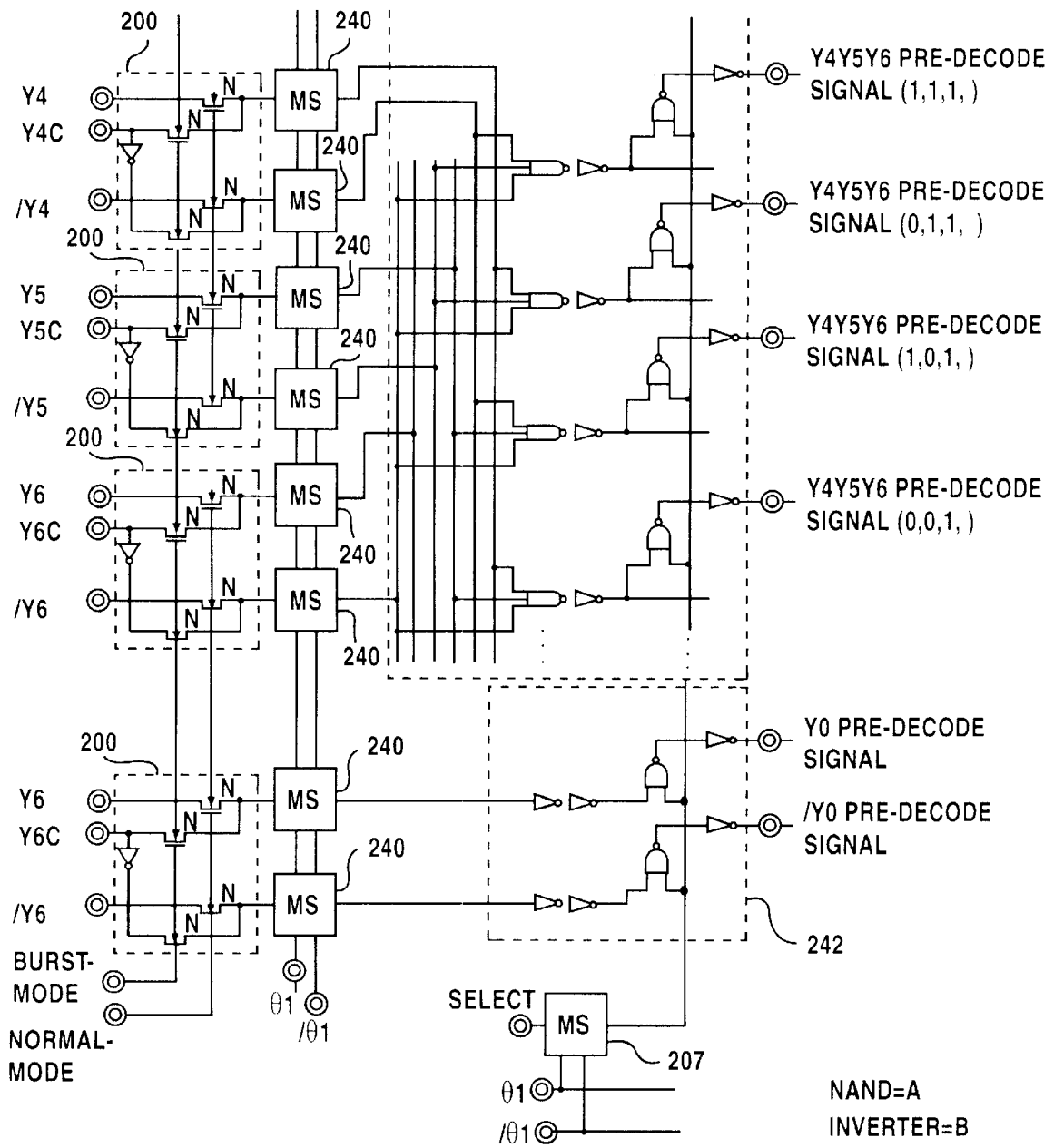

FIG. 13 is a circuit diagram of the column scheduler 44. The column scheduler 44 of FIG. 13 includes a plurality of column-address-mode-selection circuits 200, a plurality of column-address-selection MS flip-flops 240, a decoding unit 241, a column-address-selection gate unit 242, and the signal-output-timing MS flip-flop 207. The configuration of the column scheduler 44 of FIG. 13 is the same as that of the row-address-selection portion of the global row scheduler 41 shown in FIG. 12. The only difference is that the input address signals are not row address signals as in FIG. 12 but column address signals Y0 through Y6 and /Y0 through /Y6 from the address pre-decoder 13 and column address signals Y0C through Y6C from the burst-address counter 45. Since the circuit configuration and the operation of FIG. 13 are the same as those of FIG. 12, a description thereof will be omitted.

Figure 14:
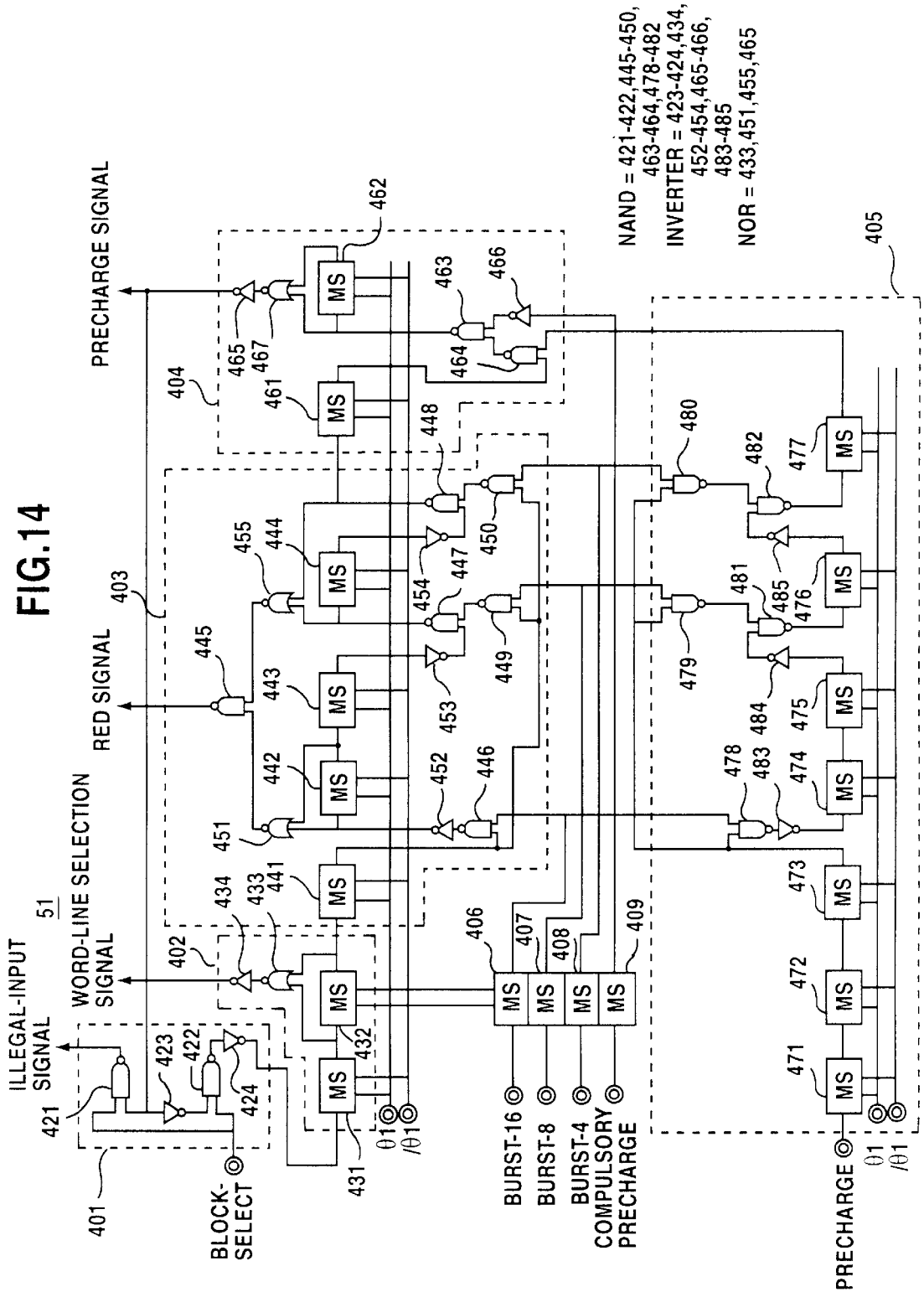
FIG. 14 is a circuit diagram of the local row scheduler of FIG. 3.

FIG. 14 is a circuit diagram of the local row scheduler 51. As shown in FIG. 14, the local row scheduler 51 includes an illegal-input checking unit 401, a word-line-selection unit 402, a read-signal-generation unit 403, a precharge-signal-generation unit 404, a precharge-mode-operation unit 405, and a plurality of MS flip-flops 406 through 409.

The MS flip-flops 406 through 409 receive signals indicating the 16-burst length, the 8-burst length, the 4-burst length, and the compulsory precharge operation, and latch these signals. Outputs of the MS flip-flops 406 through 409 are used by the read-signal-generation unit 403, the precharge-signal-generation unit 404, and the precharge-mode-operation unit 405.

The illegal-input checking unit 401 includes NAND circuits 421 and 422 and inverters 423 and 424. The illegal-input checking unit 401 detects a condition such as consecutive accesses to the same one of the blocks 50 which causes a disturbance of the pipeline operation, and outputs an illegal-input signal indicating a detection of an illegal input. In FIG. 14, a circuit for generating an illegal-input signal when the same one of the blocks 50 is selected during a precharge operation is shown as an example.

The illegal-input checking unit 401 receives the block selection signal for selecting the pertinent one of the blocks 50 from the global row scheduler 41. A precharge signal internally generated to be ON during the precharge operation and the block selection signal are input to the NAND circuit 421. An output of the NAND circuit 421 is LOW only when the block selection is made during the precharge operation, so as to indicate the detection of an illegal input. Based on this output signal, a proper measure can be taken such as making the global row scheduler 41 delay the block selection or making the global row scheduler 41 ignore the block selection of the pertinent block.

In the illegal-input checking unit 401, the NAND circuit 422 receives an inversion of the precharge signal from the inverter 423 and the block selection signal. Thus, the inverter 424 connected to an output of the NAND circuit 422 supplies the block selection signal to the word-line-selection unit 402 only when the precharge operation is not in process.

The word-line-selection unit 402, receiving the block selection signal which is HIGH after the first cycle of the internal clock θ1, outputs a word-line-selection signal during the first two cycle of the internal clock θ1 (corresponding to 8 cycles of the strobe signal Strobe) to select a word-line (row address). The word-line-selection unit 402 includes MS flip-flops 431 and 432, a NOR circuit 433, and an inverter 434. The MS flip-flops 431 and 432 form a shift register which shifts the block selection signal to the right at each cycle based on the internal clock θ1 (and /θ1). Thus, the NOR circuit 433 receiving outputs of the MS flip-flops 431 and 432 generates a LOW output during the first two cycles. Thus, the inverter 434 outputs the word-line-selection signal which is HIGH during the first two cycles.

The reason why the word-line-selection signal is HIGH for the first two cycles is because the word-line-selection operation (Select operation) and the operation for transferring data to the sense amplifier 58 (Boost operation) require two cycles in total, as shown in the schedules of FIGS. 4A through 4L.

The read-signal-generation unit 403 receives a HIGH signal during the second cycle from the word-line-selection unit 402, and outputs a read signal starting from a third cycle for a period variable according to the burst type. The read-signal-generation unit 403 includes MS flip-flops 441 through 444, NAND circuits 445 through 450, a NOR circuit 451, inverters 452 through 454, and a NOR circuit 455.

The MS flip-flop 441 receives a HIGH signal during the second cycle, and generates a HIGH signal during the third cycle. The HIGH signal during the third cycle is provided to the NAND circuits 446, 449, and 450.

In the period before the third cycle, outputs of the NAND circuits 446, 449, and 450 are HIGH since the output of the MS flip-flop 441 is LOW. Thus, an output of the inverter 452 is LOW. Since an output of the MS flip-flop 442 is LOW, an output of the NOR circuit 451 is HIGH. Also, outputs of the MS flip-flops 443 and 444 are LOW, so that outputs of the inverters 453 and 454 are HIGH, thereby resulting in both outputs of the NAND circuits 447 and 448 being LOW. Thus, an output of the NOR circuit 455 is HIGH. As a result, in the period prior to the third cycle, two inputs of the NAND circuit 445 are HIGH, so that the output of the read-signal-generation unit 403 is LOW. Only when at least one of these two inputs becomes LOW, will the output of the read-signal-generation unit 403 become HIGH.

In the third cycle, the output of the NAND circuit 446 becomes LOW when the 16-burst length is selected. Alternately, the output of the NAND circuit 449 becomes LOW when the 8-burst length is selected. Alternately, the output of the NAND circuit 450 becomes LOW when the 4-burst length is selected. Therefore, irrespective of the selected burst mode, the read signal becomes HIGH during the third cycle.

When the 4-burst mode is selected, the output of the NAND circuit 448 becomes HIGH at the third cycle. This output is read by the MS flip-flop 461 at an end of the operation of the read-signal-generation unit 403. Namely, the read-signal-generation unit 403 generates the read signal which is HIGH only during the third cycle.

When the 8-burst mode is selected, the output of the NAND circuit 447 becomes HIGH during the third cycle, so that the output of the MS flip-flop 444 becomes HIGH during a fourth cycle. The output of the MS flip-flop 444 makes the output of the NAND circuit 448 HIGH via the inverter 454. Therefore, the output of the NOR circuit 455 becomes LOW, so that the read-signal-generation unit 403 generates a HIGH signal during the fourth cycle. The HIGH output of the NAND circuit 448 is read by the MS flip-flop 461 at an end of the operation of the read-signal-generation unit 403. Namely, the read-signal-generation unit 403 generates the read signal which is HIGH during the third cycle and the fourth cycle.

When 16-burst mode is selected, the output of the inverter 452 becomes HIGH during the third cycle, so that the output of the MS flip-flop 442 becomes HIGH during the fourth cycle. Therefore, the output of the NOR circuit 451 becomes LOW, so that the read-signal-generation unit 403 outputs a HIGH signal during the fourth cycle. By the HIGH output of the MS flip-flop 442, the output of the MS flip-flop 443 becomes HIGH during a fifth cycle. The HIGH output of the MS flip-flop 443 makes the output of the NAND circuit 447 HIGH. As a result, the output of the NOR circuit 455 becomes LOW, and the read-signal-generation unit 403 outputs a HIGH signal during the fifth cycle. The HIGH output of the NAND circuit 447 is input to the MS flip-flop 444, so that the output of the MS flip-flop 444 becomes HIGH during a sixth cycle. The output of the MS flip-flop 444 makes the output of the NAND circuit 448 HIGH via the inverter 454. With the HIGH output of the NAND circuit 448, the output of the NOR circuit 455 becomes LOW. Thus, the read-signal-generation unit 403 outputs a HIGH signal during the sixth cycle. The HIGH output of the NAND circuit 448 is read by the MS flip-flop 461 at an end of the operation of the read-signal-generation unit 403. Namely, the read-signal-generation unit 403 generates the read signal which is HIGH during the third cycle, the fourth cycle, the fifth cycle, and the sixth cycle.

The precharge-signal-generation unit 404 generates a precharge signal at a predetermined timing when the precharge mode is selected. The HIGH signal supplied to the MS flip-flop 461 at a given cycle is latched by the MS flip-flop 461 one cycle later to generate a HIGH output. The NAND circuit 464 receiving the output of the MS flip-flop 461 at one input thereof receives an output of the precharge-mode-operation unit 405 at the other input thereof. When both inputs are HIGH, the output of the NAND circuit 464 becomes LOW. In this case, the output of the NAND circuit 463 becomes HIGH, so that the output of the precharge-signal-generation unit 404 becomes HIGH. The HIGH output of the NAND circuit 463 is read by the MS flip-flop 462, and, thus, the precharge-signal-generation unit 404 generates a HIGH output also during a next cycle.

Namely, the precharge operation is carried out during the fourth and fifth cycles when the 4-burst mode is selected. Alternately, the precharge operation is carried out during the fifth and sixth cycles when the 8-burst mode is selected. Alternately, the precharge operation is carried out during the seventh and eighth cycles when the 16-burst mode is selected.

The precharge-mode-operation unit 405 is used for initiating the precharge operation when the precharge mode is selected. The precharge-mode-operation unit 405 includes MS flip-flops 471 through 477, NAND circuits 478 through 482, and inverters 483 through 485. The MS flip-flops 471 through 477 constitutes a shift register which successively shifts a supplied precharge signal to the right. Thus, the output of the MS flip-flop 473 becomes HIGH during the third cycle.

When the 4-burst mode is indicated, the output of the NAND circuit 480 becomes LOW during the third cycle, so that the output of the NAND circuit 482 becomes HIGH. Thus, the output of the MS flip-flop 477 becomes HIGH during the fourth cycle. The output of the MS flip-flop 477 is supplied to one input of the NAND circuit 464 of the precharge-signal-generation unit 404. When the output of the MS flip-flop 477 becomes HIGH during the fourth cycle, the other input of the NAND circuit 464 also becomes HIGH, so that the output of the NAND circuit 464 becomes LOW. As a result, the output of the precharge-signal-generation unit 404 becomes HIGH during the fourth cycle as previously described.

When the 8-burst operation is indicated, the output of the NAND circuit 479 becomes LOW during the third cycle, so that the output of the NAND circuit 481 becomes HIGH. Thus, the output of the MS flip-flop 476 becomes HIGH during the fourth cycle. The output of the MS flip-flop 476 is supplied to the MS flip-flop 477 via the inverter 485 and the NAND circuit 482. As a result, the output of the MS flip-flop 477 becomes HIGH during the fifth cycle. During the fifth cycle, therefore, the output of the precharge-signal-generation unit 404 becomes HIGH.

When the 16-burst operation is selected, the output of the NAND circuit 478 becomes LOW during the third cycle, so that the output of the inverter 483 becomes HIGH. Thus, the output of the MS flip-flop 474 becomes HIGH during the fourth cycle. Then, the output of the MS flip-flop 475 becomes HIGH during the fifth cycle. The output of the MS flip-flop 475 is supplied to the MS flip-flop 476 via the inverter 484 and the NAND circuit 481. As a result, the output of the MS flip-flop 476 becomes HIGH during the sixth cycle. The output of the MS flip-flop 476 is supplied to the MS flip-flop 477 via the inverter 485 and the NAND circuit 482. The output of the MS flip-flop 477 becomes HIGH during the seventh cycle. Accordingly, the output of the precharge-signal-generation unit 404 becomes HIGH during the seventh cycle.

In this manner, when one of the blocks 50 is selected, the local row scheduler 51 of the selected block carries out the word-line-selection operation, the data-read operation, and the precharge operation. Also, the local row scheduler 51 controls the operation timings of the above operations based on the selected burst type, the selected precharge type, etc.

The local row scheduler 51 of FIG. 14 is merely an example, and other variations may be devised. Also, it is apparent that the data-write operation can be carried out in the same timing as that of the data-read operation described above. Further, the functions of the local row scheduler 51 may be included in the global row scheduler 41. In this case, a DRAM using the configuration of FIG. 2B according to the present invention is provided. This variation is achieved by incorporating the circuit of the local row scheduler 51 into the global row scheduler 41 and by providing control lines for conveying the operation instructions to each of the blocks 50. The modification necessary to achieve this variation may be well within the scope of ordinary skill in the field, but a detailed description thereof will be provided later as a second embodiment.

Figure 15:
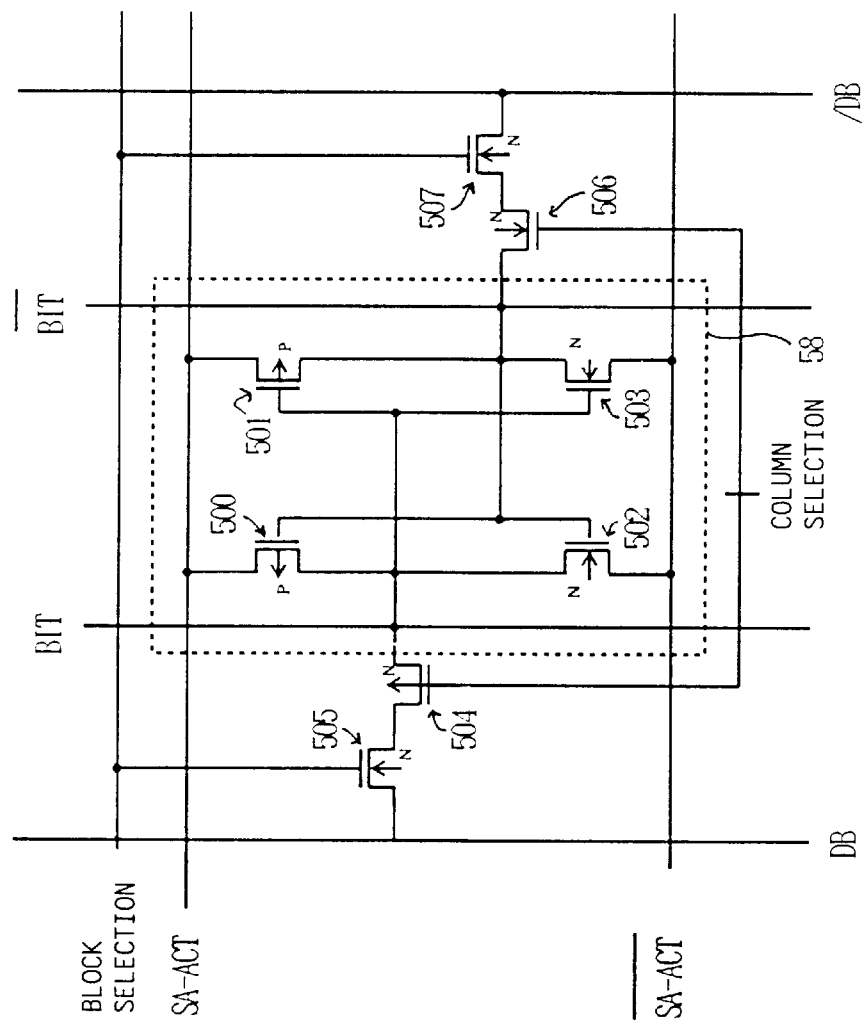
FIG. 15 is a circuit diagram of a circuit for accessing a sense amplifier of a selected column of a selected block.

FIG. 15 is a circuit diagram of a circuit for accessing the sense amplifier 58 of a selected column of a selected block. The circuit of FIG. 15 includes two PMOS transistors 500 and 501, a sense amplifier 58 comprising two NMOS transistors 502 and 503, and four NMOS transistors 504 through 507. This circuit also includes a pair of bit-lines BIT and /BIT and a pair of data-bus-lines DB and /DB (bus 60).

In FIG. 15, when both the block-selection signal and the column-selection signal become HIGH, the NMOS transistors 504 and 505 connected in a series and the NMOS transistors 506 and 507 connected in another series are turned on. In this manner, the reading of data from the sense amplifier 58 to the data-bus-lines DB and /DB and the writing of data from the data-bus-lines DB and /DB to the sense amplifier 58 become possible.

Figure 16:
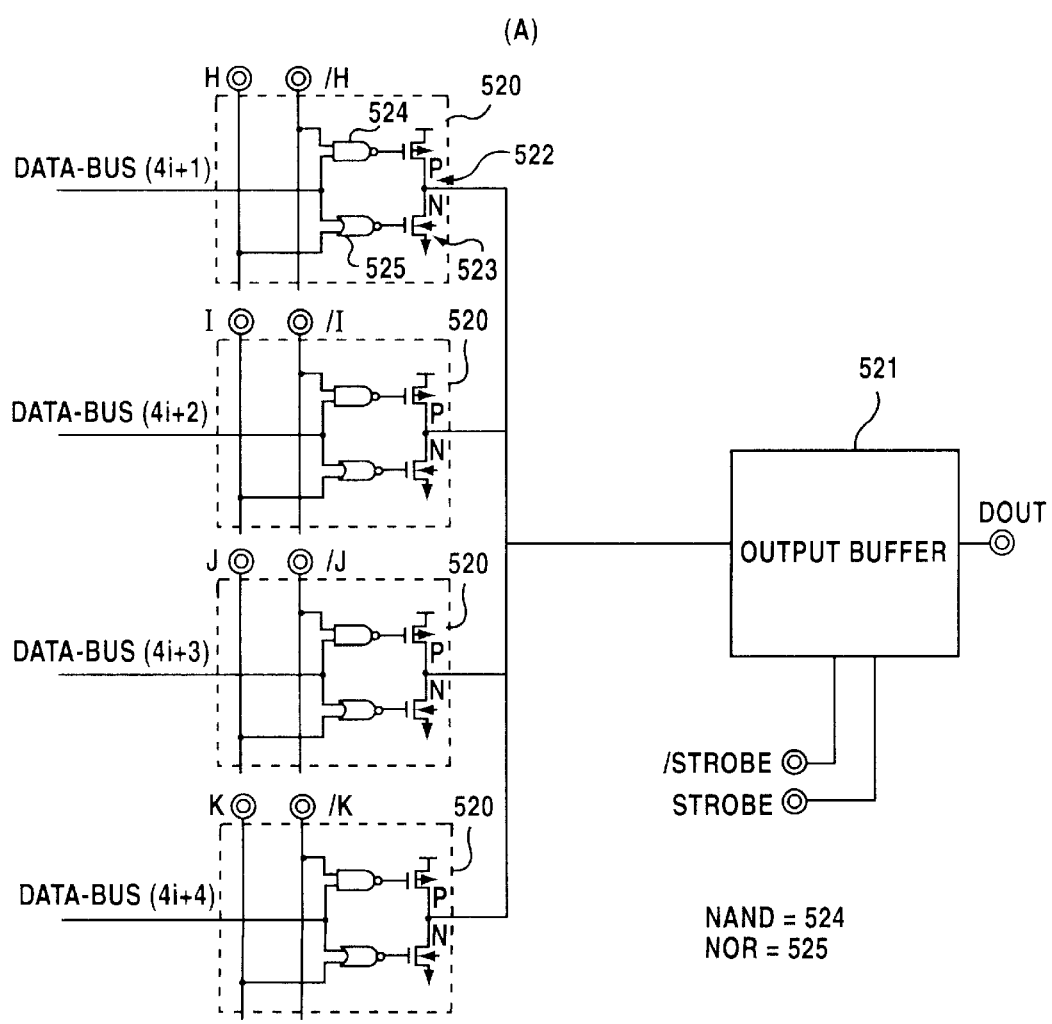
FIG. 16 is a circuit diagram of a circuit for a parallel-to-serial conversion for chip output.
Figure 17:
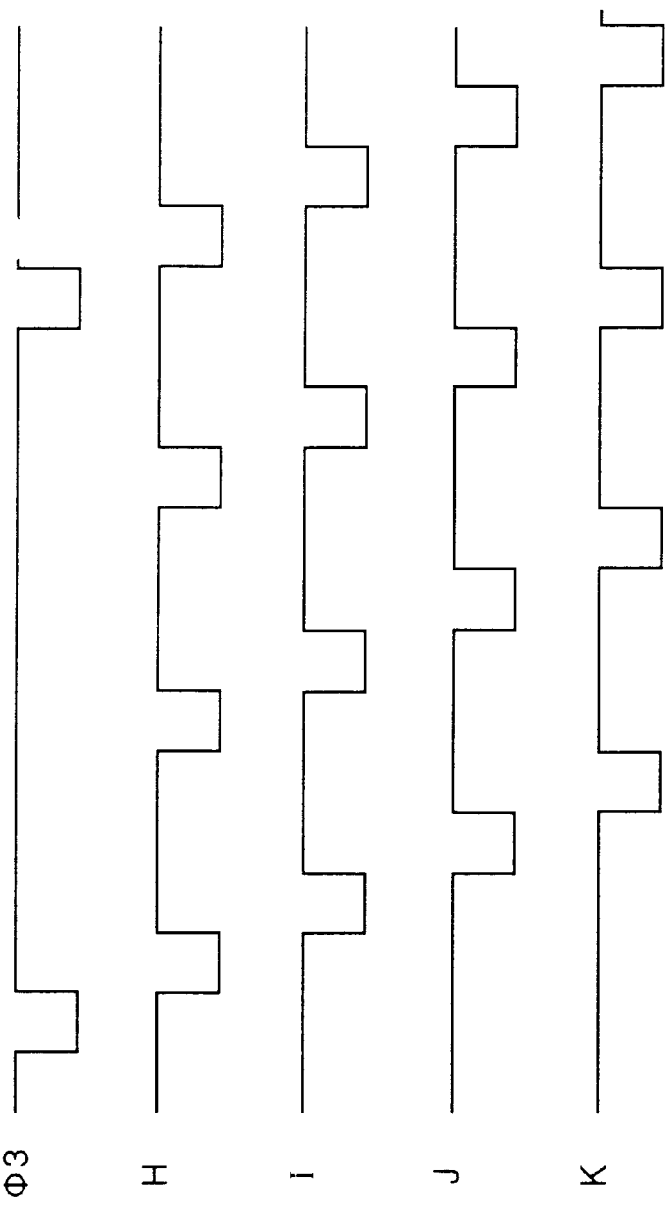
FIG. 17A through 17E are time charts of signals used in the circuit of FIG. 16.

FIG. 16 is a circuit diagram of a circuit for the parallel-to-serial conversion for the chip output. FIG. 17A through 17E are time charts of signals used in the circuit of FIG. 16. In the first embodiment of DRAM according to the present invention, a data-read operation reads 4 bits of data in parallel, and converts it into serial data at the time of the data output, as previously described with reference to the schedule of each block shown in FIGS. 4A through 4L. The circuit of FIG. 16 is an interface circuit for converting the 4-bit data from parallel data to serial data so as to output the data from the DRAM chip of the present invention.

The circuit of FIG. 16 includes tri-state buffers 520 and an output buffer 521. Each of the tri-state buffers 520 receives data via the 4-bit-parallel data bus, and is provided with internal clocks H, I, J, and K, shown in FIGS. 17B through 17E, triggered by the signal Φ3 of FIG. 17A. The internal clock H, I, J, and K are obtained by supplying the signal Φ3 in place of the A signal to the same circuit as the ½ frequency divider 102 of FIG. 8, where the outputs of the signals Φ1, Φ2, Φ3, and Φ4 are replaced by these internal clocks H, I, J, and K, respectively.

In each of the tri-state buffers 520, when the supplied internal clock is HIGH, an output of a NAND circuit 524 becomes HIGH, and an output of a NOR circuit 525 becomes LOW, so that the transistors 522 and 523 are turned off. In this condition, the output of the tri-state buffer 520 is floating. When the supplied internal clock is LOW, the tri-state buffer 520 passes the input data from the data bus to the output thereof. The output buffer 521, using a strobe signal having the same phase as the input strobe signal, holds the data supplied from the tri-state buffers 520. Accordingly, each time the internal clock H, I, J, and K successively become LOW, the tri-state buffers 520 sequentially supply the data to the output buffer 521, which outputs the data from the chip.

A plurality of the circuits of FIG. 16 are provided to correspond to the number of the output pins of the chip. For example, if the number of the output pins of the DRAM of the present invention is 16, 16 circuits the same as the circuit of FIG. 16 are provided. By the same token, if the number of input pins of the DRAM is 16, 16 circuits the same as the circuit of FIG. 7 are provided.

Figure 18:
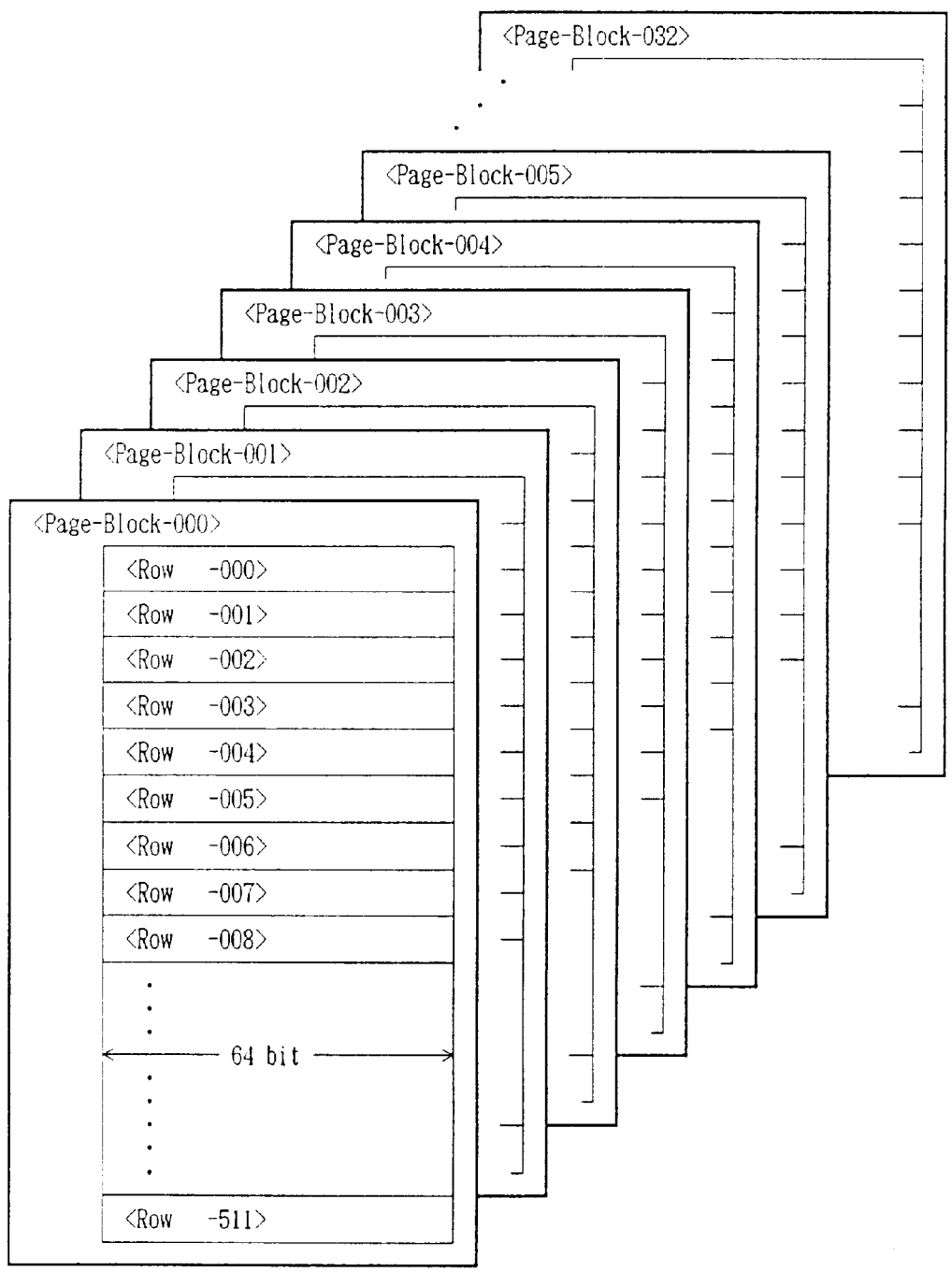
FIG. 18 is an illustrative drawing showing an example of allocation of blocks inside the DRAM chip of the present invention.

FIG. 18 is an illustrative drawing showing an example of allocation of blocks inside the DRAM chip of the present invention. As shown in FIG. 18, one block (page block) is formed as a set of 512 word-lines (row addresses), each of which correspond to 64 bits. Then, 32 such blocks are put together to form a 1M memory. If the chip has 16 output pins, 16 of such memories are assembled to form one chip.

The above-described embodiment of the DRAM according to the present invention may be applied to a conventional SDRAM. FIGS. 19A through 19L are illustrative drawings showing schedules of blocks of the SDRAM according to the present invention when the burst length is 1 and the CAS latency is 1.

Each block is initially in the ready condition. When the global row scheduler 41 selects one of the blocks 50, the local row scheduler 51 in the selected one of the blocks 50 selects a word-line at a first cycle of the internal clock Φ1 by using the Select/Boost instruction. At a second cycle, data stored in a memory cell connected to the selected word-line is transferred to the sense amplifier 58. At a third cycle, the data is read by the Read instruction. Since the burst length is 1 in this case, the reading of the data is carried out only once, with 4 bits of the data being successively read out during 4 cycles of the strobe signal. The local row scheduler 51 carries out the Precharge instruction after the Read instruction. The bit-lines are thus precharged to bring the selected one of the blocks 50 to the ready condition.

Figure 20:
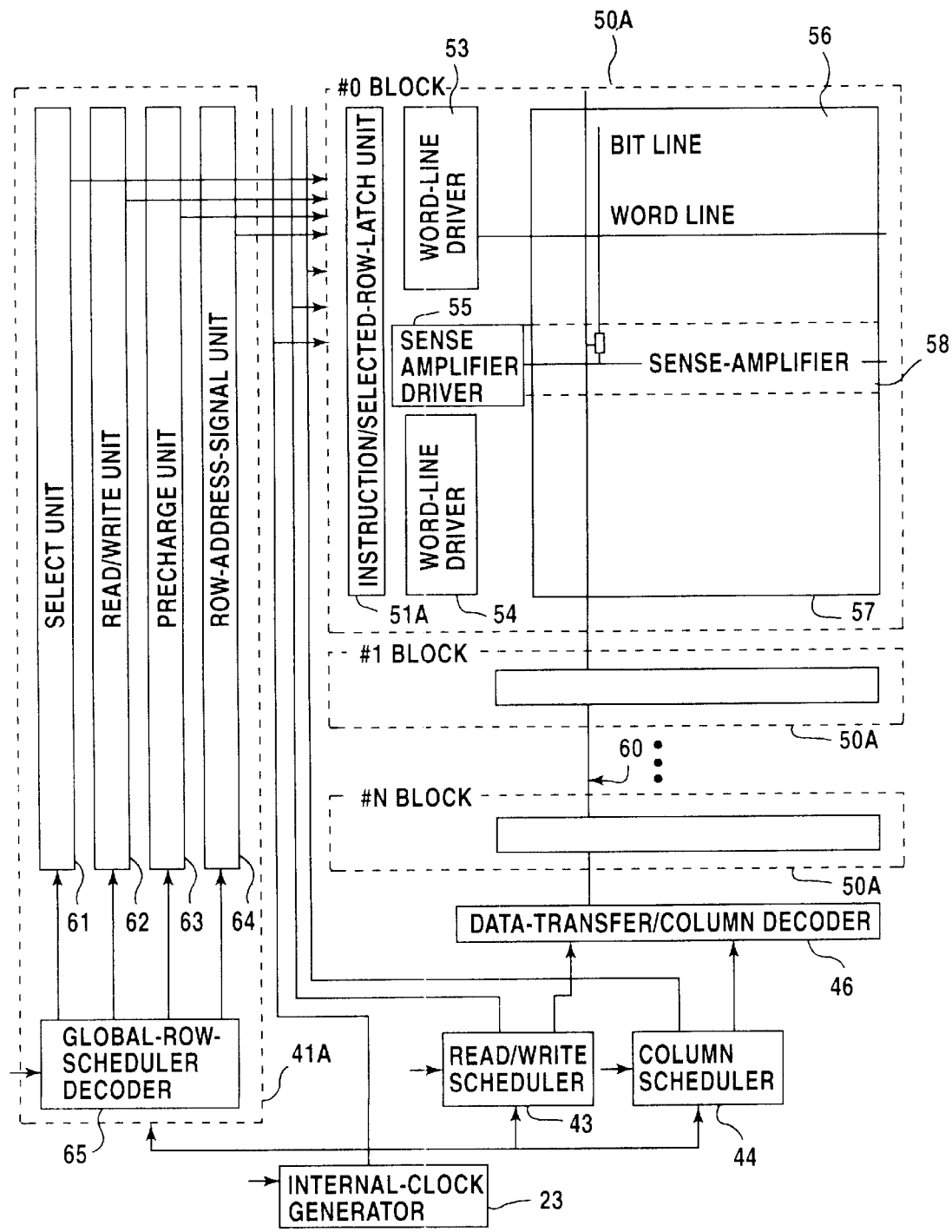
FIG. 20 is a block diagram of a DRAM according to a second embodiment of the present invention.

FIG. 20 is a block diagram of a DRAM according to a second embodiment of the present invention. The second embodiment of the DRAM shown in FIG. 20 corresponds to the configuration of FIG. 2B. In FIG. 20, the same elements as those of FIG. 3 are referred to by the same numerals, and a description thereof will be omitted.

The DRAM of FIG. 20 according to the second embodiment of the present invention includes the global row scheduler 41A and a plurality of blocks 50A. The global row scheduler 41A includes a global-row-scheduler decoder 65, a select unit 61, a read/write unit 62, a precharge unit 63, and a row-address-signal unit 64. Each of the blocks 50A includes an instruction/selected-row-latch unit 51A in place of the local row scheduler 51 and the row-address register 52 of FIG. 3.

The global row scheduler 41A receives the address, the mode, and the command from the input circuit 10 of FIG. 3. Also, the global row scheduler 41A receives the internal clock from the internal-clock generator 23, and schedules the operations for each of the blocks 50A. Namely, the global row scheduler 41A provides a selected one of the blocks 50A with instructions regarding the word-line selection, the read/write operation, the precharge operation, etc., according to the received command. In this manner, the global row scheduler 41A makes the selected one of the blocks 50A carry out operations such as the precharge operation, the refresh operation, etc.

The global-row-scheduler decoder 65 of the global row scheduler 41A decodes the received command and the received mode, and supplies appropriate decoded signals to the select unit 61, the read/write unit 62, the precharge unit 63, and the row-address-signal unit 64. The row-address-signal unit 64 generates an address signal indicating a row address in order to select a row address of a selected block 50A. The select unit 61, the read/write unit 62, and the precharge unit 63 generate the word-line-selection signal, the read/write signal, and the precharge signal, respectively, at predetermined timings to supply them to the selected one of the blocks 50A. The select unit 61, the read/write unit 62, and the precharge unit 63 can be implemented by using configurations of the corresponding portions of the local row scheduler 51 shown in FIG. 14. The row-address-signal unit 64 can be implemented in the same configuration as that of the row-address generating part of the global row scheduler 41 shown in FIG. 12.

The selected one of the blocks 50A determines the word-line to be selected based on the row-address signal supplied from the global row scheduler 41A, and carries out the operations corresponding to the word-line-selection signal, the read/write signal, and the precharge signal. The row-address signal, word-line-selection signal, read/write signal, and precharge signal are stored in the instruction/selected-row-latch unit 51A.

Figure 21:
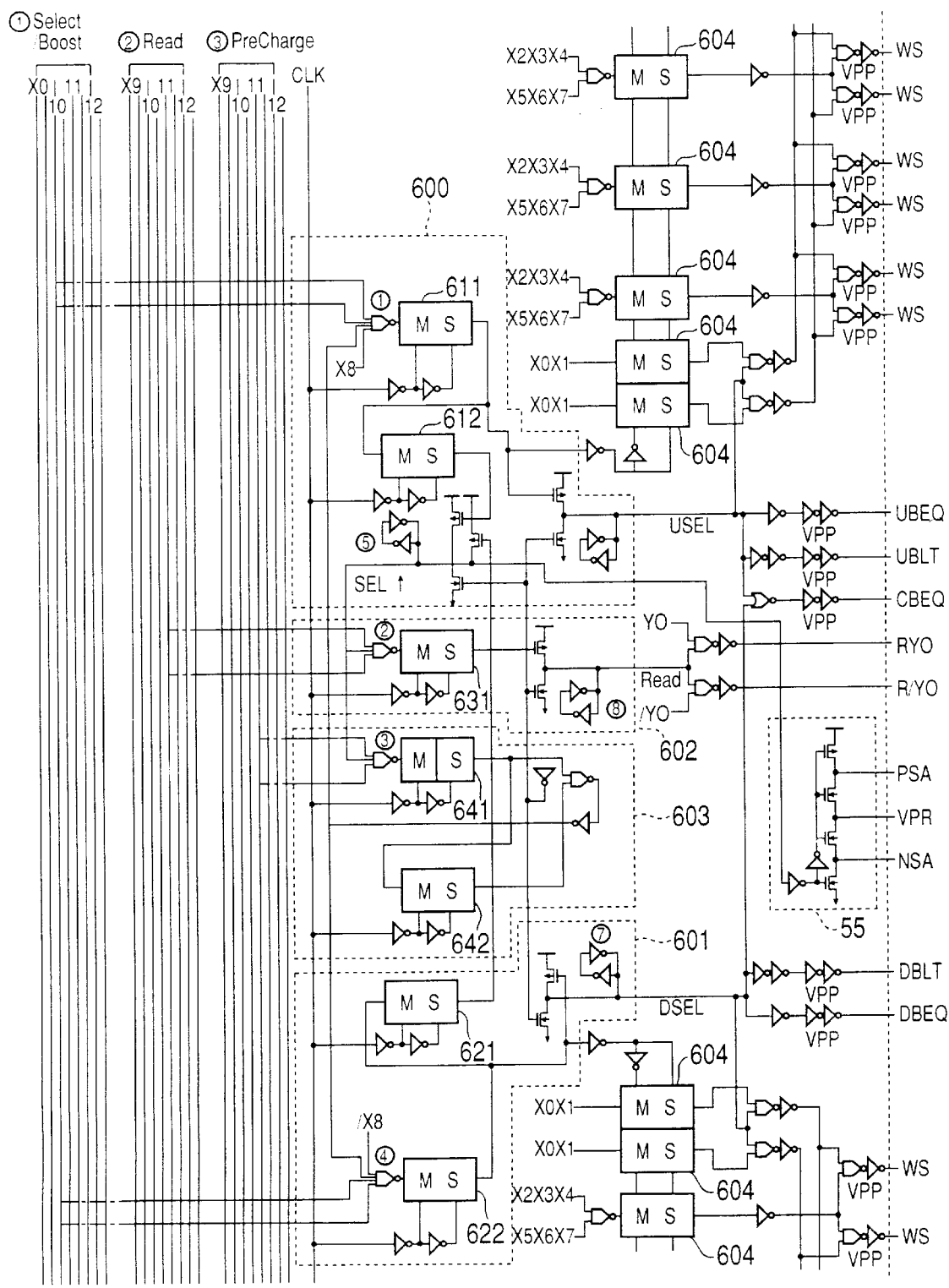
FIG. 21 is a circuit diagram showing a circuit configuration around the instruction/selected-row-latch unit of one of the blocks shown in FIG. 20.

FIG. 21 is a circuit diagram showing a circuit configuration around the instruction/selected-row-latch unit 51A of one of the blocks 50A.

In the second embodiment of the present invention, as shown in FIG. 21, each of the word-line-selection signal, the read/write signal, and the precharge signal are sent via 4-bit address lines (8 lines in actuality including another 4 lines for the complement representation). Namely, the word-line-selection signal is allocated to 4-bit address signals X9 through X12, the read/write signal is also allocated to the 4-bit address signals X9 through X12, and the precharge signal is further allocated to the 4-bit address signals X9 through X12. Then, by using the 4-bit address signals of the word-line-selection signal, for example, a selection of a word-line is instructed to the selected one of the blocks 50A.

Namely, the second embodiment of the present invention uses pre-decoded address signals for selection of the blocks 50A, and is different from the configuration of FIG. 2B which has a control line for block selection provided for each block with respect to each instruction. Such a configuration of the second embodiment makes it possible to reduce the number of the control lines, while employing the same principle as that of FIG. 2B.

In FIG. 21, the instruction/selected-row-latch unit 51A of one of the blocks 50A receives a row-address signal indicating a selected row, and reads the address signals representing each instruction in synchronization with the signal Φ1. The instruction/selected-row-latch unit 51A includes word-line-selection-signal-latch units 600 and 601, a read-signal-latch unit 602, a precharge-signal-latch unit 603, and a plurality of selected-word-line-latch units 604.

The word-line-selection-signal-latch unit 600 includes MS flip-flops 611 and 612 for latching the word-line-selection signal. The word-line-selection-signal-latch unit 601 includes MS flip-flops 621 and 622 for latching the word-line-selection signal. The read-signal-latch unit 602 includes a MS flip-flop 631 for latching the read signal. The precharge-signal-latch unit 603 includes MS flip-flops 641 and 642 for latching the precharge signal. Each of the selected-word-line-latch units 604 stores data indicating the selection of a corresponding word-line. An operation of each of elements such as inverters, NAND circuits, NOR circuits, NMOS transistors, PMOS transistors, etc., except for the above-identified MS flip-flops is easy and obvious, so that a description thereof will be omitted. Only an overall operation of the circuit will be described later.

Gates denoted as VPP are equipped with a level-conversion function for making the HIGH level into a Vpp level. These gates correspond to the word-line drivers 53 and 54 of FIG. 20. Also, a circuit portion which outputs PSA, VPR, and NSA signals corresponds to the sense-amplifier driver 55 of FIG. 20. In FIG. 21, WS signals for selecting a word-line are supplied to the memory arrays 56 and 57.

Figure 22:
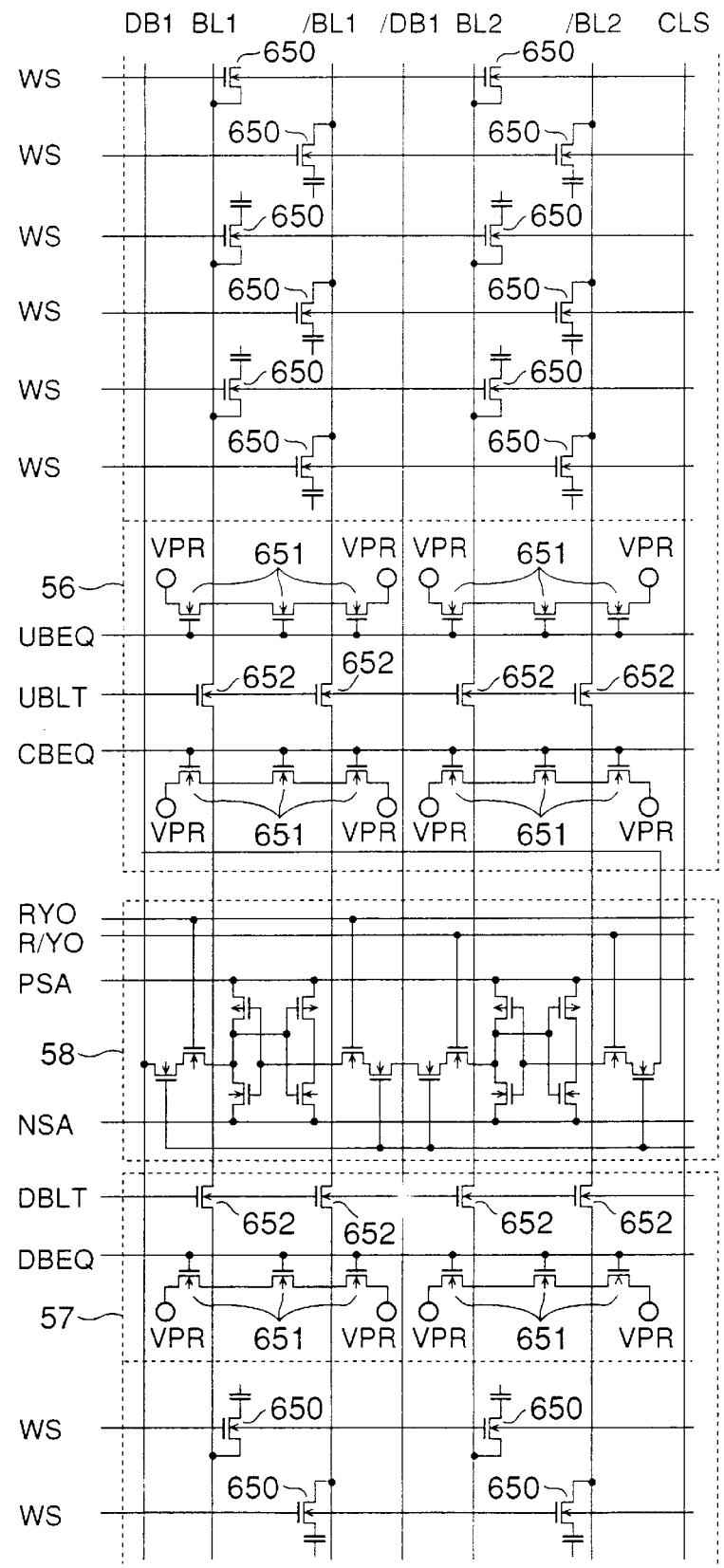
FIG. 22 is a circuit diagram of memory arrays and sense amplifiers in one of the blocks shown in FIG. 20.

FIG. 22 is a circuit diagram of the memory arrays 56 and 57 and the sense amplifier 58 of one of the blocks 50A. Each of the WS signals shown on the right-hand side of FIG. 21 is supplied to the circuits of FIG. 22 from the left-hand side thereof.

In FIG. 22, the memory arrays 56 and 57 include a plurality of memory cells 650, a plurality of NMOS transistors 651 for the precharge operation, and a plurality of NMOS transistors 652 serving as transfer gates. When either a UBEQ signal or a DBEQ signal becomes HIGH (CBEQ is also HIGH), the NMOS transistors 651 are turned on, so that the bit-lines BL1, /BL1, and so forth are precharged. When either a UBLT signal or a DBLT signal becomes HIGH, the NMOS transistors 652 are turned on, so that the bit-lines are electrically coupled with the sense amplifier 58. The sense amplifier 58 has the same configuration as that of FIG. 15, and a description thereof will be omitted.

With reference to FIG. 21 and FIG. 22, the USEL signal which is an output of the word-line-selection-signal-latch unit 600 indicates a word-line selection for an upper half of the block (memory array 56). The DSEL signal which is an output of the word-line-selection-signal-latch unit 601 indicates a word-line selection for a lower half of the block (memory array 57). A signal X0X1 is a pre-decode signal of the X0 address and the X1 address, and is comprised of four signal lines in actuality. However, only two signal lines are shown in FIG. 21 for the sake of simplicity of the figure. By the same token, a signal X2X3X4 and a signal X5X6X7 are also pre-decode signals. Based on these signals, one word-line is selected from 256 ($2^8$) word-lines in the upper half of the block.

During the time when the USEL signal is HIGH, one word-line is selected. At the same time, with this USEL signal being HIGH, the UBEQ signal (precharge signal for the upper half) becomes LOW to finish the precharge operation. Also, with this USEL signal being HIGH, the UBLT signal (transfer-gate signal for the upper half) becomes HIGH to electrically couple the bit-lines with the sense amplifier 58.

While these operation are conducted for the upper half of the block, the DSEL signal becomes LOW, so that a word-line selection is not carried out for the lower half of the block, and the DBEQ signal (precharge signal for the lower half) becomes HIGH to conduct the precharge operation. Also, the DBLT signal (transfer-gate signal for the lower half) becomes LOW to separate the bit-lines from the sense amplifier 58.

Further, one cycle after the USEL signal becomes HIGH, an SEL signal becomes HIGH. Thus, the pair of PSA/NSA (control lines for the sense amplifier) are turned to active, so that data in the memory cells 650 is read by the sense amplifier 58.

At the time of the read operation or the write operation, a read signal Read which is an output of the read-signal-latch unit 602 becomes HIGH. Thus, either a signal RY0 which is a logical sum of the read signal and the column address (Y0) becomes HIGH, or a corresponding signal R/Y0 becomes HIGH. At this point, either one of the two sense amplifiers 58 which are coupled to a column-selection line (CLS line) at the HIGH level is coupled to the data bus pair DB1 and /DB1. In this manner, the data is read from the sense amplifier 58, or the data is written in the sense amplifier 58.

In order to cancel the selection of a word-line, the pre-decode signal for the precharge operation is used for reselecting the block. In doing so, each of the USEL, DSEL, Read, and SEL signals is turned into LOW, so that the previously selected word-line is back to a non-selection level, and the precharge operation is started.

Further, the present invention is not limited to these embodiments, but variations and modifications may be made without departing from the scope of the present invention.

What is claimed is:

1. A device comprising:
    a plurality of blocks, each individual block of the plurality of blocks being capable of carrying out different types of internal operations, one internal operation at a time, each internal operation lasts one cycle; and
    a control unit configured to successively select one individual block after another from said plurality of blocks during each cycle,
    wherein, upon selection of one individual block by said control unit, execution of said different types of internal operations one after another in a predetermined order are carried out in the one individual selected block in a pipe-line operation.

2. The device as claimed in claim 1, wherein each of said plurality of blocks comprises a unit configured to execute one internal operation after another upon a block selection thereof by said control unit so as to carry out said internal operations in said predetermined order.

3. The device as claimed in claim 1, wherein said control unit instructs a block to carry out the internal operation that is first in the predetermined order to make the block selection thereof, and successively instructs said block to carry out a remaining one of the internal operations in the predetermined order.

4. The device as claimed in claim 1, further comprising
    an input unit which inputs a command/address signal, and
    a data-input/output unit which inputs and outputs a data signal, wherein each of said plurality of blocks further comprises a memory cell unit.

5. The device as claimed in claim 4, further comprising an illegal-input checking unit which detects a disturbance in said pipe-line operation with respect to the one individual block so that said selected block delays carrying out said internal operations.

6. The device as claimed in claim 4, further comprising an illegal-input checking unit which detects a disturbance in said pipe-line operation with respect to the one individual block so that the one individual block skips one of said internal operations causing said disturbance and carries out following ones of said internal operations.

7. The device as claimed in claim 4, further comprising synchronization-control unit which receives a strobe signal used for synchronizing said plurality of blocks and said control unit.

8. The device as claimed in claim 4, wherein said input unit receives a block address which indicates one of said plurality of blocks.

9. The device as claimed in claim 4, wherein each of said plurality of blocks comprises:
    an array of memory cells arranged in a plurality of rows and a plurality of columns, said array of memory cells including sense amplifiers;
    a row-address-register unit which stores data indicating a selected row which is selected from said plurality of rows,
    wherein said control unit selects one of said plurality of rows when selecting one of said plurality of blocks.

10. The device as claimed in claim 9, wherein each of said plurality of blocks further comprises:
    word lines for selecting one of said plurality of rows; and
    a driving unit which drives said word lines in synchronism with an internal clock signal in said one of said plurality of blocks.

11. The device as claimed in claim 9, wherein each of said plurality of blocks further comprises:
    word lines for selecting one of said plurality of rows; and
    a driving unit which drives said word lines in synchronism with a block-selection signal which selects said on e of said plurality of blocks.

12. The device as claimed in claim 9, wherein the selected individual blocks of said plurality of blocks in operation at a given time are one block of said plurality of blocks which is transferring data from said memory cells of said selected row to said sense amplifiers, another block of said plurality of blocks which is carrying out a data read/write operation with respect to said sense amplifiers of a selected column, and an additional block of said plurality of blocks which is carrying out a precharge operation.

13. The device as claimed in claim 9, wherein the selected individual blocks of said plurality of blocks in operation at a given time are one block of said plurality of blocks in which one of said plurality of rows is being selected, another block of said plurality of blocks which is carrying out a data write operation with respect to said memory cells, and an additional block of said plurality of blocks which is carrying out a recharge operation.

14. The device as claimed in claim 9, further comprising:
    a data bus for data transfer; and
    a plurality of MOS switches arranged in series and connected between said data bus and a given one of said sense amplifiers,
    wherein each of said MOS switches is turned on to select said given one of said sense amplifiers for said data transfer.

15. The device as claimed in claim 9, further comprising:
    a data bus for data transfer; and
    two switches arranged in series and connected between said data bus and a given one of said sense amplifiers,
    wherein each of said two switches is turned on to select said given one of said sense amplifiers for said data transfer.

16. The device as claimed in claim 15, further comprising bit lines connected to said memory cells to transfer data from said memory cells to said sense amplifiers wherein said data bus is laid out in parallel with said bit lines.

17. The device as claimed in claim 15 wherein one of said two switches is operated by a block-selection signal for selecting one of said plurality of blocks, and the other of said two switches is operated by a column-selection signal for selecting one of said plurality of columns.

* * * * *